US010025897B2

(12) United States Patent
Rajagopalan et al.

(10) Patent No.: US 10,025,897 B2
(45) Date of Patent: Jul. 17, 2018

(54) GENERATION OF CIRCUIT DESIGN POPULATIONS FOR ANALOG CIRCUIT DESIGN OPTIMIZATION

(71) Applicant: Thalia Design Automation Ltd., Cwmbran (GB)

(72) Inventors: Sowmyan Rajagopalan, Pontypool (GB); Christopher M. Yates, Wiltshire (GB)

(73) Assignee: Thalia Design Automation Ltd., Cwmbran (GB)

( * ) Notice: Subject to any disclaimer, the term of this patent is extended or adjusted under 35 U.S.C. 154(b) by 204 days.

(21) Appl. No.: 15/019,078

(22) Filed: Feb. 9, 2016

(65) Prior Publication Data

US 2016/0232268 A1     Aug. 11, 2016

Related U.S. Application Data

(60) Provisional application No. 62/114,189, filed on Feb. 10, 2015.

(51) Int. Cl.
 *G06F 17/50*     (2006.01)
(52) U.S. Cl.
 CPC ...... *G06F 17/5063* (2013.01); *G06F 17/5036* (2013.01)
(58) Field of Classification Search
 USPC ................................ 716/101, 102, 110, 132
 See application file for complete search history.

(56) References Cited

U.S. PATENT DOCUMENTS

| | | | |
|---|---|---|---|
| 5,867,397 A | 2/1999 | Koza et al. | 364/489 |
| 6,269,277 B1 | 7/2001 | Hershenson et al. | 700/97 |
| 6,526,556 B1 | 2/2003 | Stoica et al. | 716/16 |
| 6,807,652 B2 | 10/2004 | McConaghy | 716/2 |
| 6,910,192 B2 | 6/2005 | McConaghy | 716/2 |
| 6,968,517 B2 | 11/2005 | McConaghy | 716/2 |
| 7,346,868 B2* | 3/2008 | Phelps | G06F 17/5045 716/112 |
| 8,356,000 B1 | 1/2013 | Koza et al. | 706/13 |
| 8,700,548 B2 | 4/2014 | Bhandari et al. | 706/13 |
| 2003/0046278 A1 | 3/2003 | McConaghy | 707/3 |
| 2003/0093763 A1* | 5/2003 | McConaghy | G06F 17/505 716/102 |
| 2006/0015829 A1* | 1/2006 | De Smedt | G06F 17/505 716/122 |
| 2008/0104548 A1* | 5/2008 | Yan | G06F 17/5068 716/115 |
| 2012/0066657 A1 | 3/2012 | Bernstein et al. | 716/112 |

FOREIGN PATENT DOCUMENTS

WO    WO2000057550 A2    3/1999    ........... G06F 17/50

\* cited by examiner

*Primary Examiner* — Brian Ngo

(74) *Attorney, Agent, or Firm* — Christopher P. Maiorana, PC

(57) ABSTRACT

A method for analog circuit design includes the steps of (A) evaluating an initial population comprising a plurality of initial designs of an analog circuit using a computer to determine to breed a plurality of new designs that satisfy one or more regions of operation or one or more specification criteria, (B) selecting a plurality of subsets of the initial designs based on a plurality of different techniques to establish a plurality of selected designs, (C) recombining some of the selected designs to generate a plurality of recombined designs, and (D) mutating some of the recombined designs to generate the new designs.

18 Claims, 10 Drawing Sheets

GENERATION OF CIRCUIT DESIGN POPULATIONS FOR ANALOG CIRCUIT DESIGN OPTIMIZATION

This application relates to U.S. Ser. No. 62/114,189, filed Feb. 10, 2015, which is incorporated by reference in its entirety.

FIELD OF THE INVENTION

The present invention relates to designing analog circuits generally and, more particularly, to a method and/or architecture for generation of circuit design populations for analog circuit design optimization.

BACKGROUND OF THE INVENTION

Electronic chips comprise digital, analog or a combination (i.e. mixed signal) circuits. The design of analog and mixed signal circuits is generally regarded as a dark art. Conventional techniques need highly skilled and scarce engineering resources, relatively long design cycles and often multiple iterations before a final product can be brought to market. Analog circuit design methodology has remained unchanged for a long time. Analog designers have had to live with technical and time-consuming efforts in order to design and optimize analog circuits. Electronic design automation (EDA) tools needed to simplify and speed up design processes have changed (i.e., advanced) little in the past years. There is a major opportunity for more design automation in the analog circuit design sector.

It would be desirable to implement a method and/or architecture for generation of circuit design populations for analog circuit design optimization.

SUMMARY OF THE INVENTION

The present invention concerns a method for analog circuit design including the steps of (A) evaluating an initial population comprising a plurality of initial designs of an analog circuit using a computer to determine to breed a plurality of new designs that satisfy one or more regions of operation or one or more specification criteria, (B) selecting a plurality of subsets of the initial designs based on a plurality of different techniques to establish a plurality of selected designs, (C) recombining some of the selected designs to generate a plurality of recombined designs, and (D) mutating some of the recombined designs to generate the new designs.

BRIEF DESCRIPTION OF THE DRAWINGS

Embodiments of the invention will be apparent from the following detailed description and the appended claims and drawings in which:

DETAILED DESCRIPTION OF THE EMBODIMENTS

Figure 1:
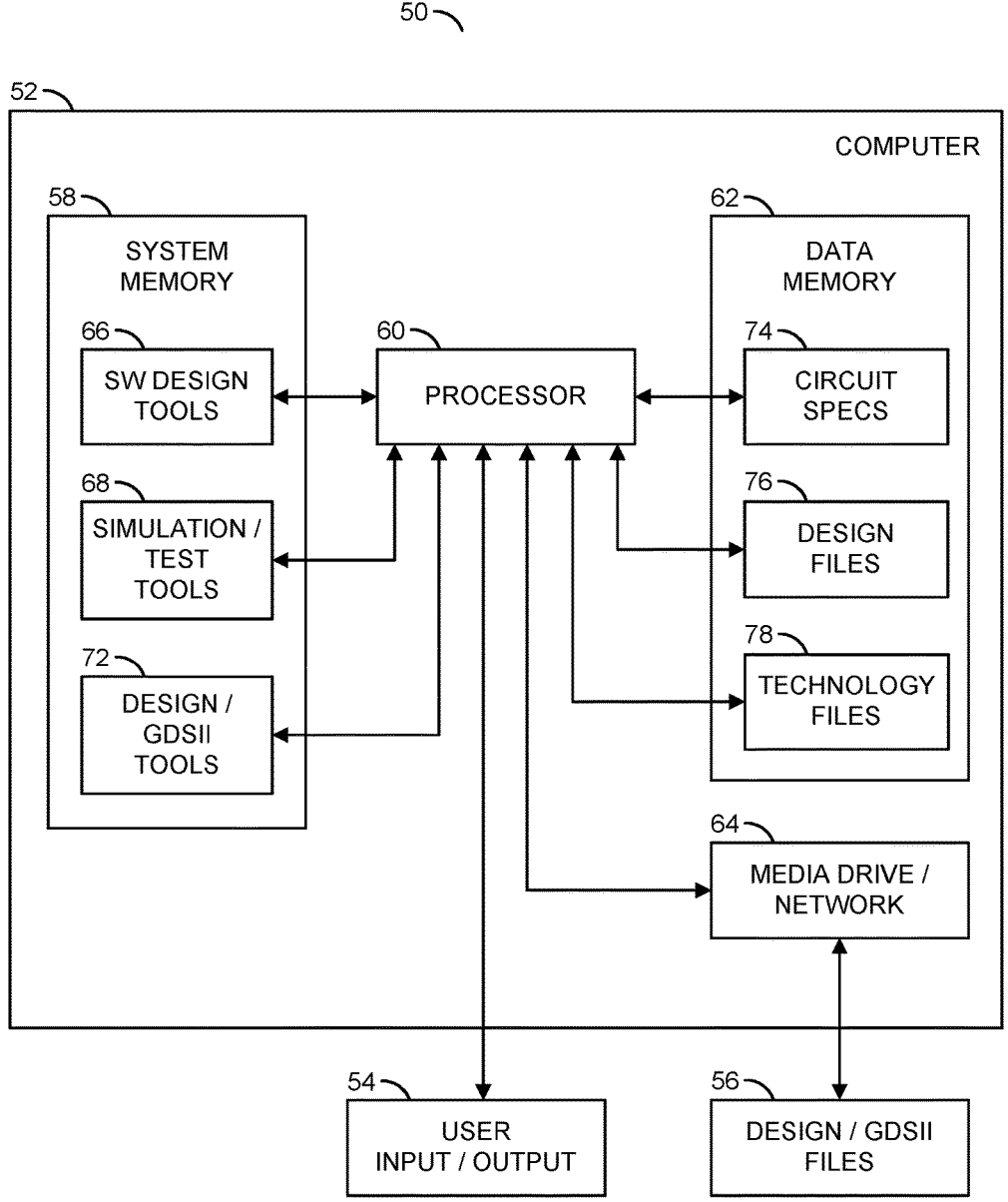
FIG. 1 is a block diagram illustrating a system in which an analog circuit design optimization process in accordance with an embodiment of the present invention may be implemented.

Embodiments of the invention include providing a method and/or apparatus for analog circuit design optimization that may (i) automatically generate a new population of analog circuit designs, (ii) improve a yield when fabricating the analog circuits compared with conventional techniques, (iii) improve process corners compared with conventional techniques, (iv) generate a matching matrix, (vi) dynamically weight the designs and/or (vii) dynamically rank the designs. Analog circuit design methods select sizes and other parameters of electronic devices in the analog circuits to satisfy a set of electrical specification criteria. The specifications include real valued quantities, areas of the circuits, and regions that the electronic devices operate in as defined by a categorical specification, but are determined by a set of voltage inequalities. The process(es) in accordance with the present invention can optimize the analog circuits for the electrical specification criteria at different levels of process parameters, voltages, and temperatures, known as process-voltage-temperature corners. Optimization of a yield is also performed, where yield is a proportion of the circuits that satisfy the electrical specification criteria under variations of the process parameters.

Relationships between device parameters and electrical specification criteria are generally complex and theoretically determined by a set of differential equations. Automating optimization of circuits involves considering millions of combinations of numerous different component parameters to select a combination that provides the best circuit performance. Therefore, the relationships between device parameters and electrical specifications of an integrated circuit (e.g., set of electronic circuits on a semiconductor die) may be multi-modal and thus may not be solvable directly through analytical means. Furthermore, any proposed circuit designs (e.g., a given set of device parameters) may depend on computer simulations to estimate the specification values without actually building the circuits. Sophisticated artificial intelligence methods may be implemented to rapidly seek an optimal solution.

The device parameters generally define a search space for optimizing an analog circuit (e.g., a circuit with one or more continuously variable signals). The device parameters, and thus the search space, may be determined by a set of features. Each device parameter generally has a maximum value and a minimum value that may constrain the search space to a bounded region. Each device parameter may have a granularity (e.g., take discrete rather than continuous values). For some parameters, the granularity may be an integer number. For other parameters, values may be a measure, such as 0.01 micrometer (e.g., um). Device parameters may be expressed in terms of other device parameters by mathematical relationships. The analog circuit may include power circuits (e.g., devices used as switches or rectifiers in power electronics), pass circuits, and switching circuits.

Similarly, a solution space may be defined by (i) electrical specifications, (ii) process, voltage, and temperature (PVT) corners, and/or (iii) yield. A notion of Pareto efficiency may be used when searching for suitable solutions. A suitable solution may be considered better than another solution, or Pareto efficient, if the suitable solution performs better with respect to every specification criterion than the other solution. Otherwise, the two solutions may be considered similar. However, in providing circuit designers with good designs, such designers may naturally rank a particular solution better than other solutions even if not Pareto efficient. Therefore, a ranking system for the solutions may be defined that roughly coincides with a natural ordering imposed by design engineers.

Referring to FIG. 1, a block diagram of an example system 50 implementing an analog circuit design optimization process in accordance with an example embodiment of the invention is shown. The system (or environment or apparatus) 50 may be a computer-based system configured for creating and optimizing analog circuit designs. In various embodiments, programming code may be implemented that turns a general purpose programmable computer into a special purpose dedicated machine. The system 50 generally comprises a block (or circuit) 52, a block (or circuit) 54, and a block (or circuit) 56. The circuit 52 may be implement as a computer-based circuit. The circuit 52 is generally operational to interact with analog circuit design files and design tools to generate a file containing an optimized analog circuit design. The circuit 54 may implement a user input/output circuit. The circuit 54 is generally operational to transfer commands (e.g., key strokes, mouse clicks, stylus movements, etc.) from a designer (or human operator) to the circuit 52. The circuit 54 may also be operational to transfer information (e.g., graphic displays, sounds, tables, charts, etc.) generated by the circuit 52 to the designer. The circuit 56 may implement one or more non-transitory storage media. The circuit 56 is generally operational to store the optimized analog circuit design files in a portable format. In some embodiments, the design files may be in a Graphic Database System II (e.g., GDSII) format. In other embodiments, the design files may be netlists and/or schematics. However, other formats may be implemented to meet the criteria of a particular application.

In various embodiments, the circuit 52 generally comprises a block (or circuit) 58, a block (or circuit) 60, a block (or circuit) 62, and a block (or circuit) 64. The circuit 58 may implement one or more system memory circuits. The circuit 60 may be implemented as one or more processor circuits (e.g., CPUs, MPUs, APUs, GPUs, etc), a processor farm, or shared scalable processing resources of a cloud-based architecture. The circuit 62 may implement one or more data memory circuits. The circuit 64 may implement one or more media drives and/or one or more network interface circuits.

The circuit 58 is generally operational to store software programs (e.g., program instructions) used to program the circuit 60. In various embodiments, the software programs generally include, but are not limited to, software design tools 66, simulation and test tools 68, and design/GDSII tools 72. In one example, the simulation and test tools 68 may comprise, but are not limited to: ADE L, XL, and GXL, part of the VIRTUOSO Analog Design Environment (ADE) family of products, and independent circuit simulators from Cadence® Design Systems; HSPICE, FineSim, and CustomSim, from Synopsys, Inc.; Eldo Classic, Eldo RF, Analog Fast Spice/Mega RF, and Analog Characterization Environment from Mentor Graphics; ADS from Agilent Technologies; behavioral model simulators, SPICE, SPICE-based, and SPICE-like simulators; etc. In various embodiments, the design/GDSII tools 72 may include, but are not limited to, Cadence VIRTUOSO layout and schematic editor & composer, Synopsis Talus, Tanner L-edit, Open source GDSII software, Mentor Graphics Pyxis Schematic and Layout, layout automation editors, layout visualizers, layout compactors, layout routers and placement, layout implementers, etc.

Components in the semiconductor circuits are characterized by dozens of mathematical partial differential equations. Simulation and test tools 68 are utilized to solve the mathematical equations and generate an output discernible by users. The design tool 66 generates several variations of the circuit to be tested and transfers the circuits to be validated and characterized using a simulator in the simulation and test tools 68. Once the equations have been solved and the circuit functionality has been characterized, the simulator feeds the data back to the design tool 66. The design tool 66 collates the results and uses the collated results in driving the optimization process in the right direction towards a solution.

The inputs and outputs to the design tool 66 may come from an editor where the circuit is laid out. In various embodiments, the design or schematic which defines the electrical and functional characteristics is the primary source of input to the software (SW) toolset 66. The SW toolset 66 generates the files utilized to generate circuits from the schematic or design. GDSII tools may facilitate viewing the output of the SW toolset 66 and may impact the direction of the optimization process in the SW toolset 66. The software programs within the circuit 58 may be read and executed by the circuit 60. In some embodiments, the circuit 58 may be implemented as a hard drive, such as a magnetic hard drive and/or a flash drive. However, other mass memory/storage technologies may be implemented to meet the criteria of a particular application.

The circuit 60 is generally operational to read, interpret, and execute the software programs and data files stored in the circuits 58 and 62. The circuit 60 may implement a reduced instruction set computer (e.g., RISC), a complex instruction set computer (e.g., CISC) or other standard computer processors.

The circuit 62 is generally operational to store data files used by the circuit 60 to generate and optimize designs of analog circuits. The data files generally include, but are not limited to, one or more circuit specifications 74, one or more analog circuit design files 76, and one or more technology data files 78. The data files within the circuit 62 may be read from and written to by the circuit 60. In some embodiments, the circuit 62 may be implemented as a hard drive, such as a magnetic hard drive, and/or a flash drive. However, other mass memory/storage technologies may be implemented to meet the criteria of a particular application. In various embodiments, the circuit 58 and the circuit 62 are implemented as separate memory/storage devices. In other embodiments, the circuit 58 and the circuit 62 may be combined into a single mass memory/storage device.

The circuit 64 is generally operational to read from and write to the circuit 56 and/or a network (e.g., a local area network, a wide area network, the Internet, etc.). The circuit 64 may receive files from the circuit 56 and/or network and store the received files in the circuits 58 and/or 62. The circuit 64 may also receive files from the circuits 58 and/or 62 and transfer the received files to the circuit 56 and/or the network.

Figure 2:
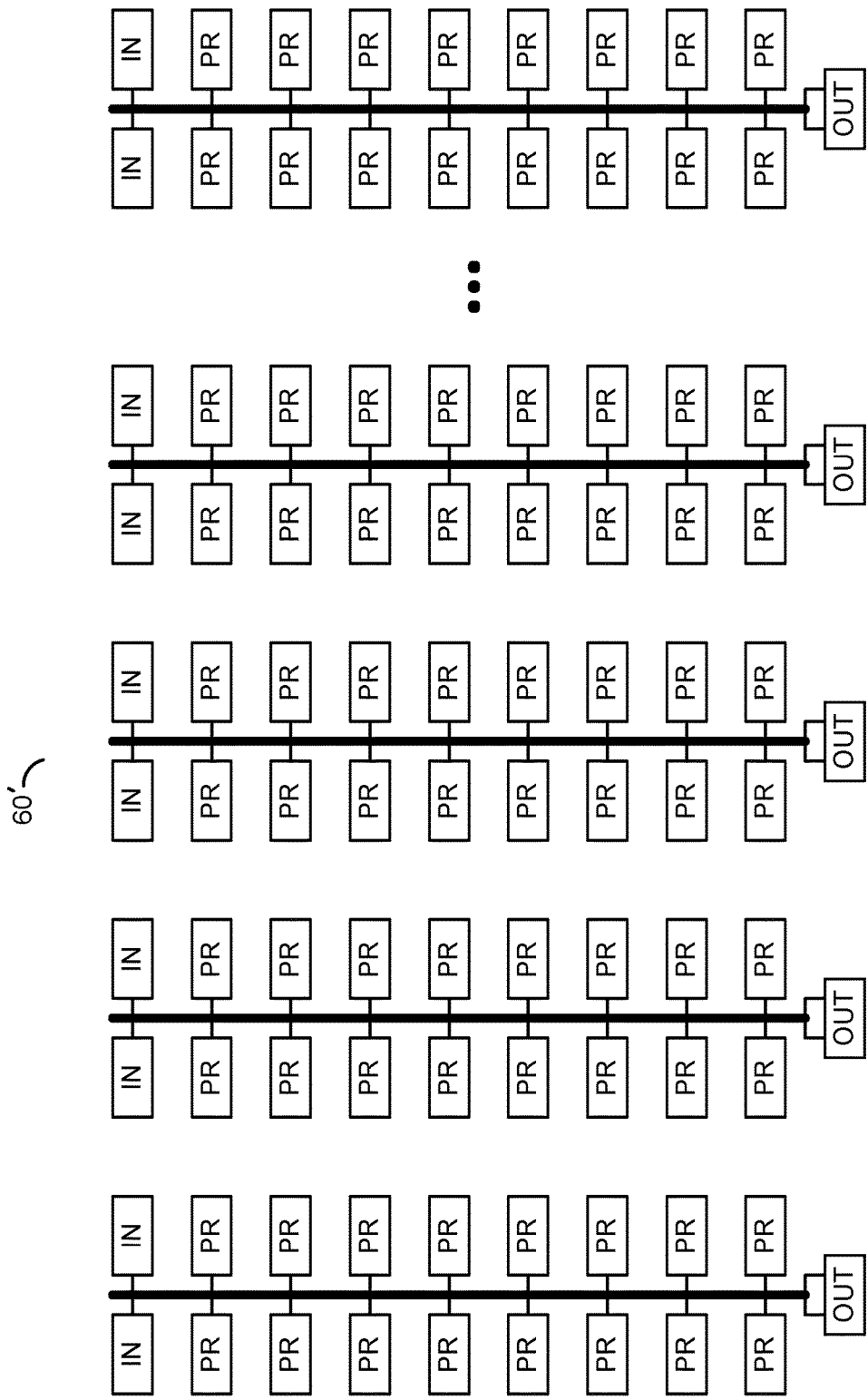
FIG. 2 is a block diagram illustrating an example of a processor farm that may be implemented as part of the system of FIG. 1.

Referring to FIG. 2, a diagram is shown illustrating an example implementation of a processor farm 60'. In some embodiments, the processor farm (or processor cluster or server farm or server cluster) 60' may be used to implement the processor 60 in FIG. 1. In one example, the processor farm 60' may comprise a large number of processors (e.g., hundreds, thousands, etc.) that may be configured to process analog circuit design information in accordance with the present invention. In various embodiments, processors (PR) may be configured to provide massively parallel processing of designs (e.g., circuit simulation, circuit verification, circuit test, etc.). In one example, the processor farm 60' may comprise high speed processors connected by either gigabit Ethernet or custom interconnects, such as Infiniband, Myrinet, etc.

Figure 3:
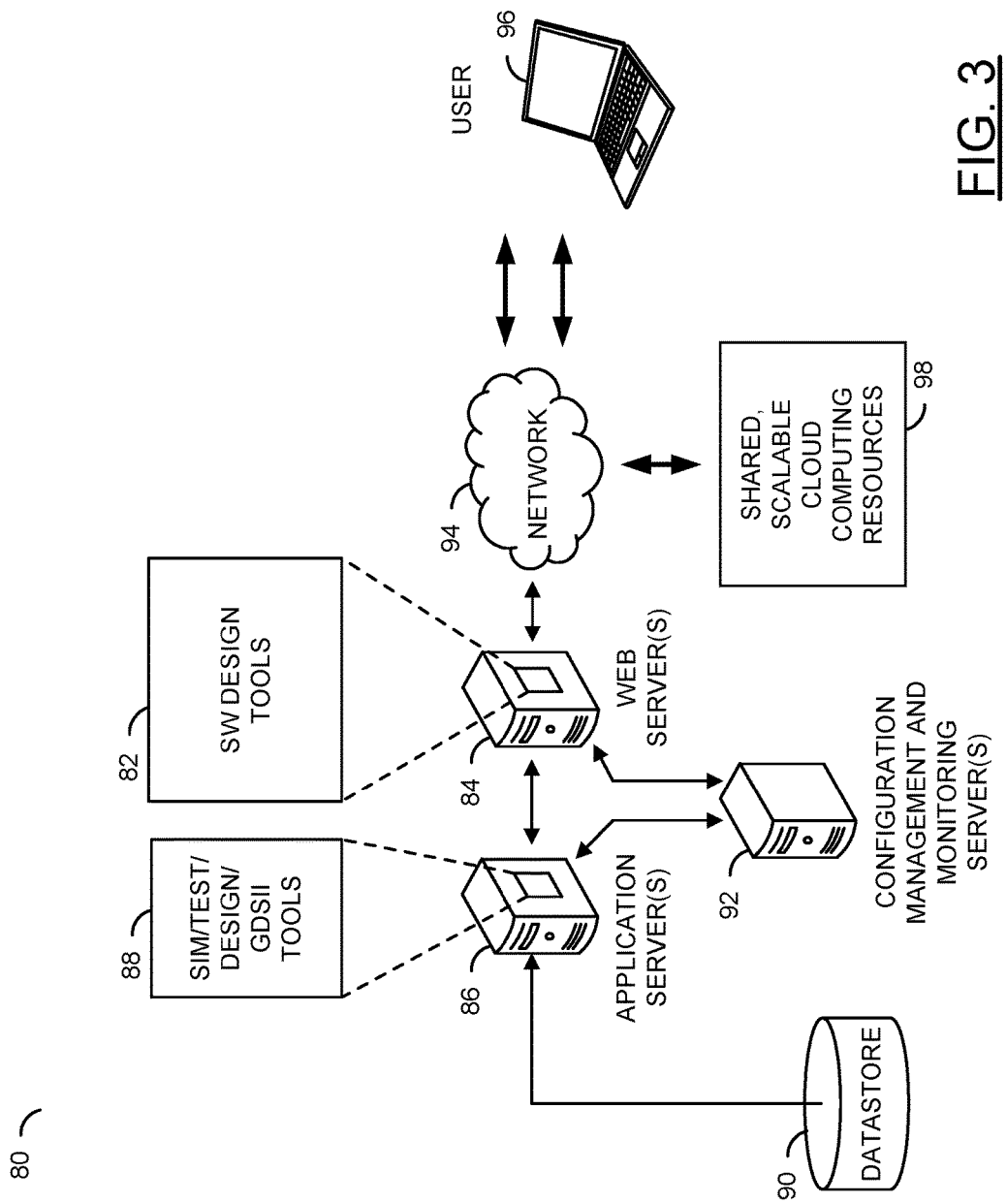
FIG. 3 is a block diagram illustrating an example of a shared scalable cloud-based architecture implementing the system of FIG. 1.

Referring to FIG. 3, a diagram is shown illustrating an application in accordance with the present invention implemented in the context of cloud-based system. A proliferation of smart phones, tablets and the Internet of Things (IoT) products has increased demand for semiconductor chips. Companies are under pressure to design electronic systems faster, better and cheaper. In one example, design support services may be delivered to electronics and semiconductor companies using a cloud-based infrastructure 80. In one example, an analog circuit optimization process in accordance with the present invention may be run on one or more secure cloud-based servers accessible to a user via a network (e.g., the Internet, a virtual private network, etc.). In one example, the cloud-based infrastructure 80 may provide shared scalable resources including, but not limited to web servers 84, application servers 86, datastores 90, configuration management and monitoring servers 92, and other shared scalable computing resources 98.

In various embodiments, a user 96 is connected to the infrastructure 80 via a network 94. The user 96 may execute software design tools 82 in accordance with embodiments of the present invention using the cloud-based infrastructure 80. For example, the web server(s) 84 may be enabled to utilize electronic design automation (EDA) tools (e.g., simulation, test, design, and GDSII tools) 88 run on one or more of the application servers 86. The software tools 82 and the simulation tools 88 may be enabled to use information stored in one or more of the datastores 90. The EDA tools 88 may be provided by electronic design automation companies for use by clients via the cloud network. For example, the application servers may provide a variety of design tools including, but not limited to a library characterization tool to create abstract electrical and timing models used by chip design tools and methodologies, a logic verification tool to simulate electronic systems described using a hardware description language (e.g., the RTL, VHDL, Verilog, etc.) and a circuit simulation tool (e.g., Spice, etc.) that may be used to check design integrity and predict circuit behavior. The EDA tools 88 may be available on a shared facility and built on cloud infrastructure. Because chip designs are highly secret in nature, the cluster may implement physical and network isolation to protect workloads for enhanced security. The cloud services may use single-tenant servers, which means that clients do not share servers. Firewalls and other technologies may also be implemented to secure the proprietary data of each user.

The cloud computing model has the potential to satisfy scalability requirements that occur in electronic design automation. The cloud embodiment may enable users the flexibility to scale up or down based on demand. Users also gain other benefits of the cloud, including increased design productivity, reduced capital expenditure and increased operation efficiency. With the cloud services, users may avoid purchasing new hardware, EDA tool licenses, or data center technology, or even hiring IT staff to manage on premises environments.

Figure 4:
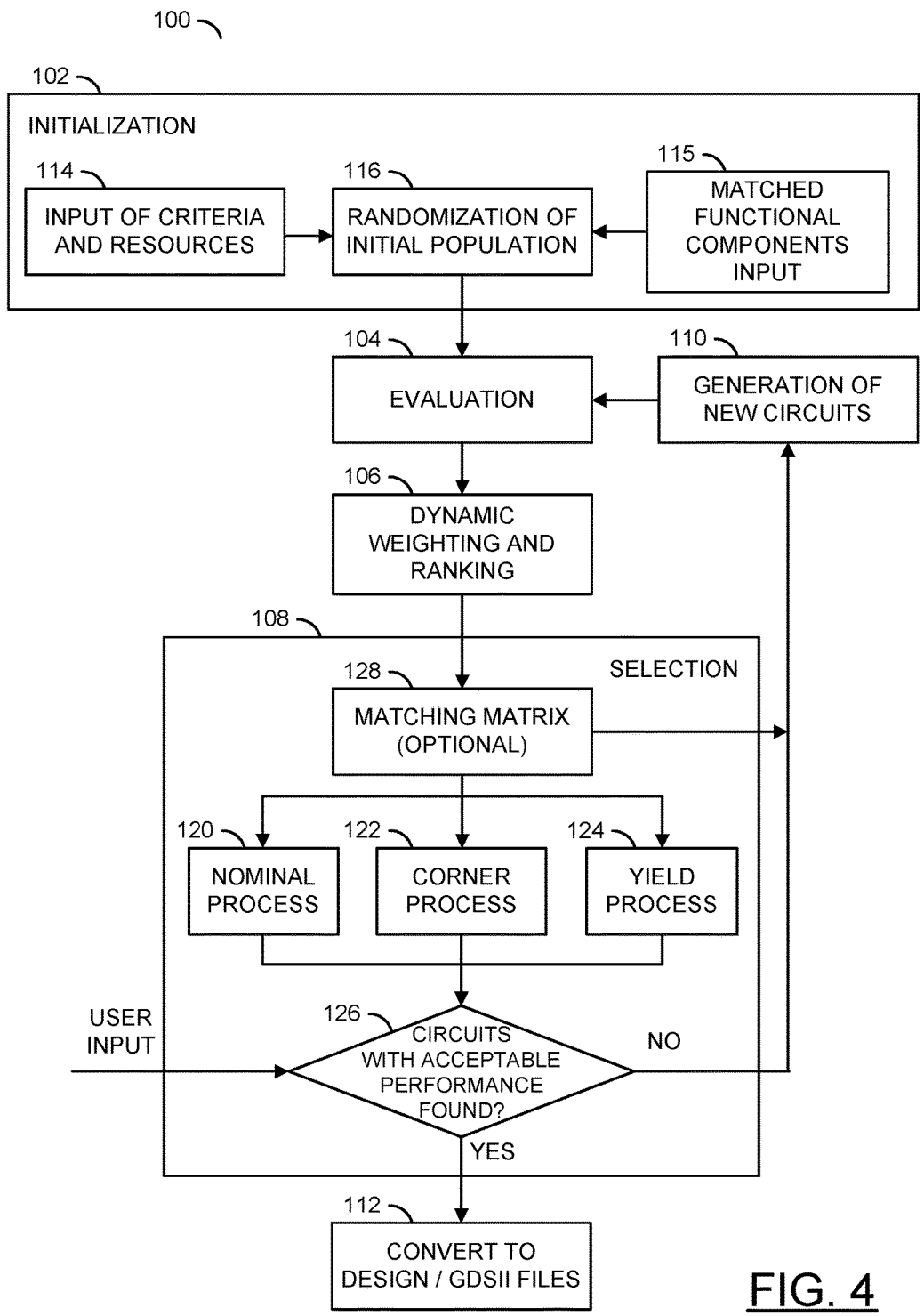
FIG. 4 is a flow diagram illustrating an analog circuit design optimization process in accordance with an embodiment of the present invention.

Referring to FIG. 4, a flow diagram illustrating an analog circuit design optimization process 100 in accordance with an embodiment of the present invention is shown. The process (or technique or method) 100 may be implemented in the system 50 or the system 80 via computer software and/or a machine performing the software steps. Optimization generally refers to a process directed toward modifying a circuit design to achieve all electrical specification criterion and regions of operation of the circuit design. The technique may comprise multiple optimization processes. The optimization processes may be conducted sequentially or in parallel (e.g., concurrently or simultaneously). In one example, optimization processes may include, but are not limited to a nominal optimization process, a corner optimization process, and a yield optimization process. The nominal optimization process generally optimizes the design for a nominal corner (e.g., with no process, voltage, or temperature (PVT) variation or consideration of the yield). The corner optimization process may optimize the design across all PVT corners. The yield optimization process may optimize the design based on yield.

In various embodiments, the process 100 comprises a step (or state) 102, a step (or state) 104, a step (or state) 106, a step (or state) 108, a step (or state) 110, and a step (or state) 112. The step 102 may comprise an initialization process. The step 104 may comprise an evaluation process. The step 106 may comprise a dynamic weighting and ranking process. The step 108 may comprise a selection process. The step 110 may comprise a circuit generation process. The step 112 may comprise an output conversion process.

In the step 102, analog circuit details, specifications, parameter ranges, granularities, and associated files may be entered for use in generating an optimized analog circuit design. In various embodiments, the step 102 comprises a step (or state) 114, a step (or state) 115, and a step (or state) 116. In the step 114, analog circuit details, specifications, parameter ranges, granularities, etcetera are entered into the process 100 from the one or more circuit specifications 74, the one or more analog circuit design files 76, and/or the one or more technology data files 78. In the step 115, matched functional components data may be gathered from the one or more technology data files 78. In the step 116, an initial generation (population) of diverse random solutions is generated to provide an initial set of guesses for priming the optimization process 100. The population of random solutions then grows as better guesses are made during the optimization process 100.

In the step 104, the solutions generated in the step 102 are evaluated using an electrical simulator (e.g., one or more of the simulation/test tools 68) to provide values of electrical specification criteria (e.g., either for nominal, PVT corners, or yield). The step 104 may also provide feedback to the designers (users) by monitoring log files and output/error streams of the electrical simulator used. In the step 106, a dynamic weighting and ranking process may assign optimization weights to each specification criteria and device region. The current population of analog circuits (solutions) may also be ranked in the step 106.

In the step 108, optimization process or processes are selected and performed on the population of circuit solutions provided by the step 106. In various embodiments, the step 108 may comprise a step (or state) 120, a step (or state) 122, a step (or state) 124, and a step (or state) 126. In some embodiments, an optional step (or state) 128 may also be implemented. The step 120 may implement a nominal optimization process. The step 122 may implement a corner optimization process. The step 124 may implement a yield optimization process. The step 126 implements a decision process. The optional step 128 may implement a matching matrix process. The nominal optimization process 120 generally optimizes the nominal corner with no process, voltage, or temperature (PVT) variation or consideration of the yield. The corner optimization process 122 generally optimizes the population of solutions across all PVT corners. The yield optimization process 124 may optimize the population of solutions based on yield. The optimization processes 120, 122 and 124 may be conducted sequentially or in parallel (e.g., concurrently or simultaneously). In embodiments implementing the optional matching matrix process 128, a matching matrix may be used to match parameters between similar devices. When implemented, the matching matrix 128 is generally updated each time the dynamic weighting and ranking process of the step 106 is performed. Depending upon the particular optimization(s) selected by the user, the process 100 may perform the optimization process 120 for a nominal corner (no PVT variations or yield) analysis, the optimization process 122 for a PVT corner analysis, and/or the optimization process 124 for a yield analysis. The design tool software 66 is generally capable of running any combination of the analysis modules 120, 122, and 124 simultaneously.

After the selected optimization process or processes have been performed, the process 100 moves to the step 126 and determines whether circuits with acceptable performance have been found. The determination may be based on predefined criteria or a real-time user input. If acceptably performing circuits have not been found, the process 100 moves to the step 110. In the step 110, new circuit designs may be generated based on the results of the matching matrix (if implemented), nominal analysis process 120, corner analysis process 122, and/or the yield analysis process 124. The new circuit designs may become part of a next (or intermediate) generation (population) of analog circuit designs. The new generation may be subsequently evaluated in the step 104, undergo the dynamic weighting and ranking in the step 106, further selection in the step 108. If the user is only interested in nominal optimization 120, the process 100 may proceed straight to the generation of new circuits 110. Otherwise, if the user is interested in either corner optimization and/or yield optimization, the corner process 122 and/or yield process 124 may be instantiated prior to the generation of the new circuit designs. The loop comprising the steps 104 to 110 may continue until a final analog circuit design is created. When the final analog circuit design is obtained, the process 100 moves to the step 112, where the final analog circuit design may be converted into a design file and/or a GDSII file.

In various embodiments, the inputs and resources entered in the step 114 generally comprise a set of scripting files, a set of netlists, a list of devices and respective parameters with respective corresponding permitted ranges, a list of parameters not pertaining to a device, a set of region of operation criteria for each relevant device (e.g. MOS type transistors, etc.) and a set of specification criteria. The scripts are dependent upon the particular electrical simulator used and provide instruction for the particular simulator in extracting the relevant data from a simulation. There may be a plurality of scripts each representing a specific test bench that is used for measuring specifications and for specifying corners (PVT). Separate scripts for yield simulation may also be utilized. A set of netlists, each representing a specific test bench, is used to provide the information on circuit design to the simulator.

TABLE 1

| Device type | Dev. name | Parameter name | Min | Max | Granularity | Value or expression |
|---|---|---|---|---|---|---|
| PMOS | PM1 | PM1_Length | 0.18 um | 10 um | 0.01 um | |
| | | PM1_Width | 0.18 um | 20 um | 0.01 um | |
| | | PM1 Fingers | 1 | 10 | 1 | |
| PMOS | PM2 | PM2_Length | | | | PM1_Length |
| | | PM2_Width | | | | 2*PM1_Width |
| | | PM2 Fingers | | | | PM1 Fingers |
| NMOS | NM1 | NM1_Length | 018 um | 5 um | 0.01 um | |
| | | NM1_Width | 0.18 um | 10 um | 0.01 um | |
| | | NM1_Fingers | | | | 4 |
| Capacitor | C1 | C1_Length | 5 um | 25 um | 0.1 um | |
| | | C1_Width | | | | C1_Length |
| Resistor | R1 | R1 Length | 1 um | 100 um | 0.1 um | |
| | | R1_Width | 0.2 um | 2 um | 0.01 um | |

TABLE 1, above, illustrates an example set of device-related inputs. For each device, the type, name, parameters and either the ranges permitted or an expression or value are entered. For example, an entry for a PMOS device PM1 specifies Length, Width and Fingers parameters and respective ranges. An entry for a PMOS device PM2 specifies the Length parameter be equal to the Length parameter of the PMOS device PM1, whereas the Width parameter is specified to be twice that of the Width parameter of the PMOS device PM1. An entry for an NMOS device NM1 sets the Fingers parameter to 4. The matching of device parameters is represented by the step 115.

TABLE 2

| Specification name | Greater than | Less than | Target | Priority |
|---|---|---|---|---|
| PSRR at DC | | −90 dB | −100 dB | 2 |
| PSRR at 200 Hz | | −90 dB | −100 dB | 2 |
| Load regulation | −35 mV | 35 mV | 0 mV | 3 |

TABLE 2-continued

| Specification name | Greater than | Less than | Target | Priority |
|---|---|---|---|---|
| VREG sleep mode | 1.6 V | | 1.8 V | 3 |
| VREG max | 2.15 V | 2.25 V | 2.2 V | 1 |
| Current no load | | 25 uA | 5 uA | 1 |
| Area | | 40000 sq um | 10000 sq um | 1 |

An example of the specification information that may be entered is illustrated in TABLE 2 above. Each specification specifies a name that coincides with the names of specifications in the scripts, a set of inequalities that include either a less than or greater than criterion, or both less than and greater than criteria. It is these inequalities that the optimization process is directed to solving. A target value representing an ideal value for the specification may also be supplied. A default value is used if no target is supplied. A priority representing the importance of the particular specification to the designer is also entered (e.g., 1 being most important, 2 less so, etc.).

TABLE 3

| | | Region of Operation | | | |
|---|---|---|---|---|---|
| Device type | Device name | Cut off | Triode | Saturation | Subthreshold | Breakdown |
| PMOS | PM1 | | | X | | |
| PMOS | PM2 | | X | X | | |
| NMOS | NM1 | | X | X | X | |

An example of the regions of operation input is shown in TABLE 3 above. In one example, each PMOS and NMOS type transistor is given a set of allowable regions of operation. Thus, the PMOS device PM1 is specified to be in Saturation, the PMOS device PM2 can be in either in Triode or Saturation, and the NMOS device NM1 can be in either of Triode, Saturation or Subthreshold.

Figure 5:
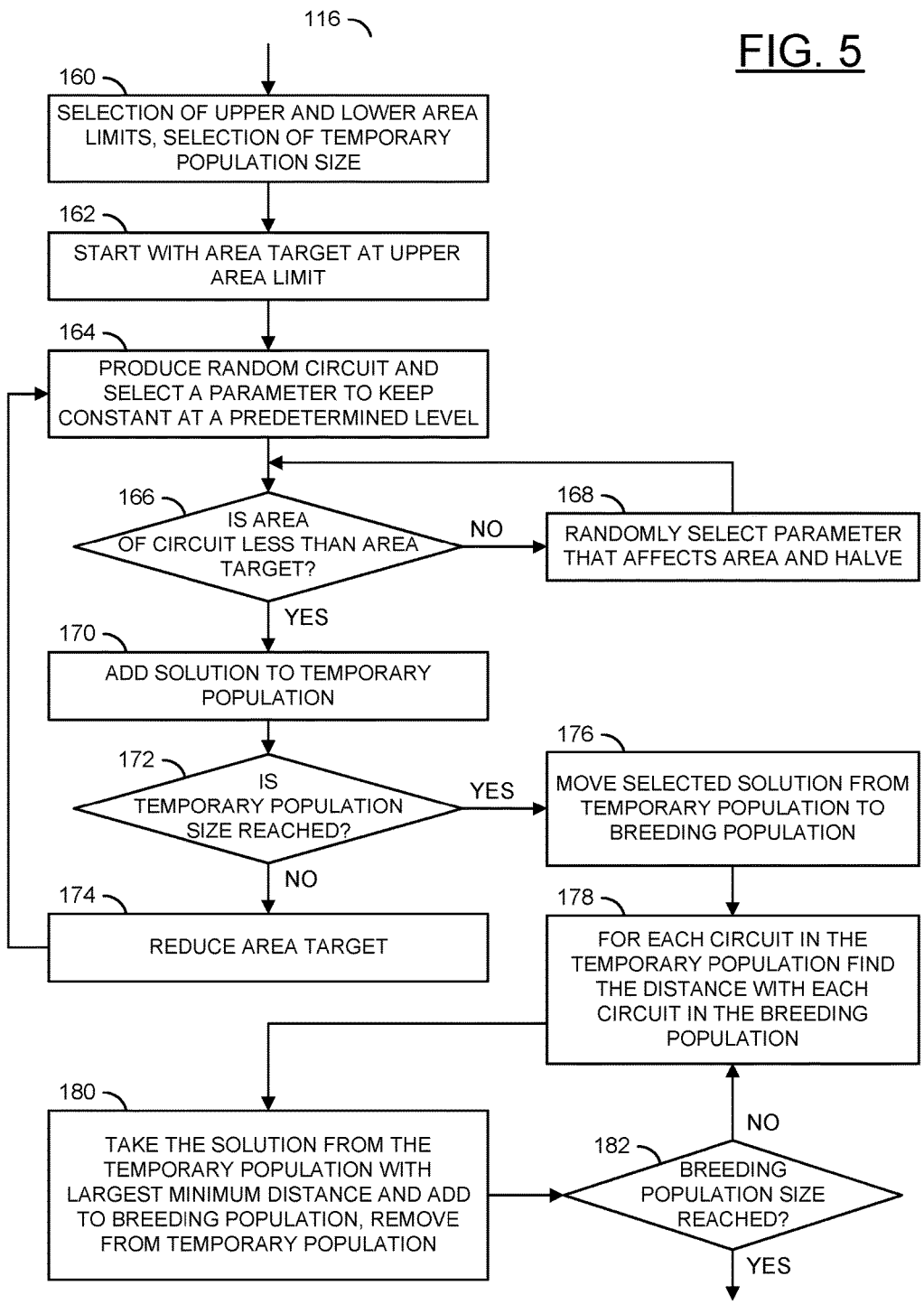
FIG. 5 is a detailed flow diagram illustrating a randomization process.

Referring to FIG. 5, a detailed flow diagram illustrating an example implementation of the randomization method (or step) 116 of FIG. 4 is shown. The method (or technique or process) 116 may be implemented in the system 50 or the system 80 via computer software and/or a machine performing the software steps. The method 116 generally provides a diverse set of the initial analog circuit designs for simulation. However, an area specification criterion may bypass the simulating and thus may be calculated immediately as the circuit designs are generated. Therefore, an initial distribution of circuit designs may have areas distributed about a target area specification. The distribution generally reduces a search space and provides a better starting position than other common methods.

In various embodiments, the method 116 generally comprises a step (or state) 160, a step (or state) 162, a step (or state) 164, a step (or state) 166, a step (or state) 168, a step (or state) 170, a step (or state) 172, a step (or state) 174, a step (or state) 176, a step (or state) 178, a step (or state) 180, and a step (or state) 182. In the step 160, upper area target limits, lower area target limits and a temporary population size may be selected (or determined or specified) from the data files and/or user inputs. In the step 162, an area target may be set to the upper area target limit. In the step 164, a random circuit design may be generated with a selected parameter kept constant at a predetermined level. The random circuit design step 164 generally produces random circuit designs between the lower area target limit and the upper area target limit to encompass circuit designs that meet, or are close to meeting, the area objective. Furthermore, a principle of the Latin Hyper Cubes technique may be included to provide a diverse range for each parameter.

The method 116 generally follows from an input of the problems and the resources in the steps 114 and 115 of the process 100. The step 160 may select the upper area target limits and the lower area target limits from which to generate a random sample of circuit design solutions. The area may be defined as a sum of the areas of all devices (e.g., transistors, traces, capacitors, resistors, etc.) that make up each circuit design. The user generally supplies an area objective (target) value such that the total area should be less than the objective value. For example, the area of randomly generated circuit designs may range from between a fraction (e.g., 0.85) and a multiple (e.g., 1.5) of the target area as specified. The lower area target limit may be specified to be actually achievable by calculating the size of the smallest possible circuit based on a minimum dimension setting for each device.

The parameters for each device are generally allowed to vary between a lower limit and an upper limit taking discrete values between the limit boundaries. For instance, a length of a PMOS transistor, depending upon technology, may vary between 0.3 um and 10 um with a granularity of 0.01 um. In practice, the smaller the granularity the better the performance of the optimization process. For example, given a parameter (e.g., nf) defining a number of gate fingers and a parameter (e.g., m) defining a number of instances (or copies) of a device, if the width of a transistor device varies between 1.0 um and 50 um, and the m parameter and the nf parameter are allowed to take integer values between 1 and 100, the smallest area of the transistor device may be 0.3 um×1 um×1×1=0.3 square um. Summing across all devices generally gives a minimum possible area.

Each circuit design may be considered as having a set of parameters related to the dimensions of each device in that circuit design, and other generic parameters as a set of results for specifications criteria and transistor device regions. Thus, a circuit design (e.g., C) may contain:
$P_i$ i=1, . . . , n a set of n parameters
$S_j$ j=1, . . . , m a set of m specifications criteria
$R_k$ k=1, . . . , r a set of r regions of operation
A Euclidean distance (e.g., $d_{ab}$) between two circuits Ca and Cb may be defined by the following Equation 1:

$$d_{ab} = \left( \sum_{i=0}^{n} (P_{ai} - P_{bi})^2 \right)^{1/2} \quad \text{(EQ. 1)}$$

The initialization process may begin by generating random circuit designs between the lower and upper area bounds. In practice many (e.g., 100) times more circuit designs than suitable for the initial breeding population may be generated. The process may be as follows. For an $i^{th}$ random circuit design, set a maximum area as $A_u-((A_u-A_l)(i-1)/n)$, where $A_u$ represents the upper area limit, $A_l$ represents the lower area limit, and n represents the total number of circuits specified. Select a parameter value to keep constant and set that parameter value at a predetermined level. The levels chosen may depend upon the number of parameters available and the total number of circuit designs to be initialized. Generate a random circuit design by randomly selecting a value for each device parameter, excluding the parameter held constant, between the minimum and maximum allowed dimensions using a uniform distribution. Calculate the area of the resulting circuit design.

In the step 166, a check of the area may be performed. If the area of the circuit design is less than the area target, the process 116 proceeds to the step 170. If the area is larger than the area target, the process 116 proceeds to the step 168. In the step 168, a parameter is randomly selected, excluding the parameter held constant, and the value of the randomly selected parameter is adjusted (e.g., halved) relative to the smallest allowable dimension. The area of the circuit design may be calculated again and if determined smaller than the area target in the step 166, the process continues to the step 170. If the area remains larger than the area target, the process of selecting a parameter at random and adjusting (e.g., halving) until the circuit design meets the area target criteria (e.g., steps 166 and 168) is repeated. The process of selecting a parameter at random for adjustment (e.g., halving) as well as fixing a chosen parameter creates circuit designs that may have high values for some parameters and low values for others thus creating diversity. In contrast, if all parameters were reduced simultaneously, the circuit designs would tend to have uniformly small values for all parameters.

In the step 170, the circuit designs smaller than the area target may be added to the temporary population of circuit designs. A check of the size of the temporary population may be performed in the decision step 172. If the temporary population size is less than desired, the area target may be reduced in the step 174 and the method 116 may return to the step 164 to generate additional random circuit designs. Once the intended temporary population size is reached, the method 116 may continue with the step 176.

Once the intended number of the initial circuit designs has been produced (e.g., typically 100 times the size of the initial breeding population criterion), the set of circuit designs may be reduced in the step 176 to provide a diverse breeding population. The reduction is generally achieved by selecting a circuit design at random from the temporary population to move into the breeding population. In the step 178, a Euclidean distance may be calculated between the selected circuit design (now in the breeding population) and all other candidate circuit designs (in the temporary population). The circuit design with the greatest distance may be moved from the temporary population to the breeding population in the step 180. Distances from the newly added circuit design and all other circuit designs in the temporary population may be calculated in the step 178. Each circuit design in the temporary population may now have two distances calculated from the two circuit designs added to the breeding population. A minimum of each of the two distances is determined. The circuit design with the largest minimum distance is generally selected to enter the breeding population. The process may be repeated until the desired breeding population size (e.g., 32 circuit designs) is generated, per the decision step 182. For situations that include process, voltage and temperature (PVT) corners, a larger breeding population may be created. Once the method 116 has finished, the solutions may be passed to the evaluation step 104. Application of the evaluation step 104 to the circuit designs and use of the circuit areas to provide a random sample may create a well suited starting position for optimization. As used herein, a breeding population generally refers to a population of circuits waiting for testing, an overall population generally refers to a population of circuits that have been simulated, and a temporary population refers to any temporary population created for facilitating the an optimization process in accordance with an embodiment of the invention.

TABLE 4

| Device type | Device name | Parameter name | Value or expression |
|---|---|---|---|
| PMOS | PM1 | PM1_Length | 2.55 um |
|  |  | PM1_Width | 0.65 um |
|  |  | PM1_Fingers | 3 |
| PMOS | PM2 | PM2_Length | PM1_Length |
|  |  | PM2_Width | 2 * PM1_Width |
|  |  | PM2_Finger | PM1_Fingers |
| NMOS | NM1 | NM1_Length | 4.8 um |
|  |  | NM1_Width | 2.1 um |
|  |  | NM1_Fingers | 4 |
| Capacitor | C1 | C1_Length | 12.5 um |
|  |  | C1_Width | C1_Length |
| Resistor | R1 | R1_Length | 56 um |
|  |  | R1_Width | 1.2 um |

The information gathered from the initialization block 102 and the process to generate a set of initial circuit designs provides the input for evaluation in the block 104. For each candidate solution, a set of parameter inputs are supplied using the initialization process. TABLE 4 above provides examples of parameter inputs. There is one unique set of inputs for each candidate circuit in the initial set. The information on parameters is entered into the scripts and or netlists modified from those presented in block 114. The precise insertion of the information depends on the electrical simulator used, but typically comprises a syntax that gives the parameter name and an associated value or expression. For instance, using an Ocean simulator the relevant section in the script may be summarized as follows:

desvar ("PM1_Length" 2.55)
desvar ("PM1_Width" 0.65)
desvar ("PM1_Fingers" 3)
desvar ("PM2_Length" PM1_Length)
desvar ("PM2_Width" 2*PM1_Width)
desvar ("PM2_fINGERS" PM1_Fingers)
etc.

The original scripts supplied in the block 114 may also be modified for each candidate circuit depending upon the PVT corner or corners selected by changing references to model files that specify the operational performance of devices. Yield scripts are modified to provide an initial seed to generate random process variation and the number of Monte Carlo runs to perform. The modified scripts and netlists are presented to the electrical simulator which returns the values for the specifications for each candidate solution.

TABLE 5

| Device type | Device name | Parameter name | Min | Max | Minimum area | Maximum area |
|---|---|---|---|---|---|---|
| PMOS | PM1 | PM1_Length | 0.18 um | 10 um | 0.0324 sq um | 2000 sq um |
|  |  | PM1_Width | 0.18 um | 20 um |  |  |
|  |  | PM1 Fingers | 1 | 10 |  |  |

TABLE 5-continued

| Device type | Device name | Parameter name | Min | Max | Minimum area | Maximum area |
|---|---|---|---|---|---|---|
| PMOS | PM2 | PM2_Length | 0.18 um | 10 um | 0.324 sq um | 2000 sq um |
| | | PM2_Width | 0.18 um | 20 um | | |
| | | PM2 Fingers | 1 | 10 | | |
| NMOS | NM1 | NM1_Length | 018 um | 10 um | 0.0324 sq um | 2000 sq um |
| | | NM1_Width | 0.18 um | 20 um | | |
| | | NM1 Fingers | 1 | 10 | | |
| Capacitor | C1 | C1_Length | 5 um | 25 um | 25 sq um | 625 sq um |
| | | C1_Width | 5 um | 25 um | | |
| Resistor | R1 | R1 Length | 1 um | 100 um | 0.2 sq um | 200 sq um |
| | | R1_Width | 0.2 um | 2 um | | |
| Total area | | | | | 26.172 sq um | 6825 sq um |

A numerical example may be used to illustrate the process of creating an initial breeding population. TABLE 5 above shows ranges, devices and parameters for a hypothetical circuit design. Furthermore, suppose that the area specification for this hypothetical design is less than 100 sq um. The first step is to determine areas within which to produce circuits. In the step 160, the upper area limit may be set to twice the specification (e.g. 200 sq um), while the lower limit may be set to approximately the mid-point between the lowest possible area and the specification (e.g., approximately 60 sq um). The step 160 may be completed by setting the size of the temporary population to 3000.

TABLE 6

| Device type | Device name | Parameter name | Value | Area |
|---|---|---|---|---|
| PMOS | PM1 | PM1_Length | 8 um | 1024 sq um |
| | | PM1_Width | 16 um | |
| | | PM1_Fingers | 8 | |
| PMOS | PM2 | PM2_Length | 4 um | 144 sq um |
| | | PM2_Width | 12 um | |
| | | PM2_Fingers | 3 | |
| NMOS | NM1 | NM1_Length | 7 um | 119 sq um |
| | | NM1_Width | 17 um | |
| | | NM1_Fingers | 1 | |
| Capacitor | C1 | C1_Length | 15 um | 90 sq um |
| | | C1_Width | 6 um | |
| Resistor | R1 | R1_Length | 10 um | 40 sq um |
| | | R1_Width | 4 um | |
| Total area | | | | 1417 sq um |

In the step 162, the process is set to start with an area target of 200 sq um. TABLE 6 above shows an example initial circuit generated at random. In the step 164, a parameter is selected at random to keep constant, that is its value cannot be altered during the process. For this example, the parameter PM1_Width is selected. In the step 166, the process moves to the step 168 as the total area is 1417 sq um which is greater than the target of 200 sq um.

In the step 168, a parameter, other than PM1_Width, is chosen at random. For this example, R1_length is chosen and halved. The resulting circuit now has an area of 1397 sq um. This process of selecting parameters and halving their value, but not exceeding the lower limit shown in TABLE 5, is continued until the circuit is less than 200 sq um. This circuit is then added to the temporary population.

In the step 172, if the temporary population size is less than 3000, the area target is reduced in the step 174. In one example, the change is accomplished using linear interpolation between the lower and upper targets, thus the nth target would be 200−n*(200−60)/3000. Thus, the 3000th circuit would need to be less than 60 sq um.

Once the size of the temporary population reaches 3000, a circuit is chosen at random and moved into the breeding population. Using Equation 1, the distance between the chosen circuit and all circuits in the temporary population are calculated. The circuit in the temporary population with the largest distance is then moved to the breeding population. The continuation of the selection of circuits to move to the breeding population is illustrated in TABLE 7 below. In TABLE 7, the size of the temporary population has been reduced for simplicity. The distance between each temporary population member and each breeding population member is calculated. The smallest distance found for each temporary population member and all breeding population members is recorded. The maximum of these shortest distances is chosen as the selection criterion for moving a member of the temporary population into the breeding population. Thus, temporary population member 6 is moved. This process continues until the specified breeding population size is met. In various embodiments, the breeding population size is typically chosen to be 32.

TABLE 7

| | Distance to breeding population member 1 | Distance to breeding population member 2 | Shortest distance to any breeding population member |
|---|---|---|---|
| Temporary population member 1 | 28 | 15 | 15 |
| Temporary population member 2 | 83 | 47 | 47 |
| Temporary population member 3 | 5 | 18 | 5 |
| Temporary population member 4 | 67 | 35 | 35 |
| Temporary population member 5 | 22 | 12 | 12 |
| Temporary population member 6 | 73 | 70 | 70 |
| Temporary population member 7 | 16 | 42 | 16 |

Figure 6:
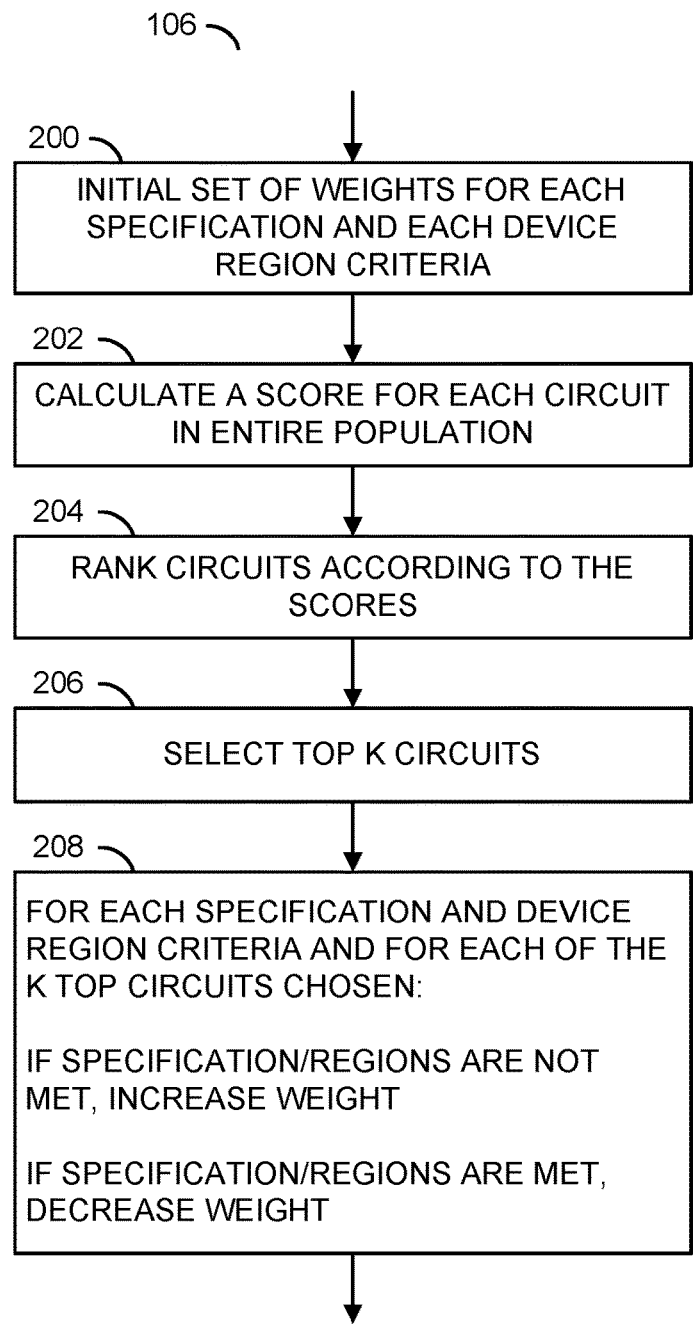
FIG. 6 is a detailed flow diagram illustrating a dynamic weighting and ranking process.

Referring to FIG. 6, a detailed flow diagram illustrating an example implementation of the dynamic weighting and ranking method 106 of FIG. 4 is shown. The method (or technique or process) 106 may be implemented in the system 50 or the system 80 via computer software and/or a machine performing the software steps. The method 106 generally comprises a step (or state) 200, a step (or state) 202, a step (or state) 204, a step (or state) 206, and a step (or state) 208.

To facilitate an efficient exploration of the search space and to represent the preferences of the designer, a dynamic weighting and ranking process may be used. In some embodiments, a problem involving multiple objectives (e.g., specification criteria) may use a Pareto Ranking system to rank a fitness of circuit designs and to maintain diversity. In various embodiments, a current circuit design may only be ranked above another if the current circuit design is better with respect to every specification criterion. In other embodiments, the fitness may be measured by a single measure defined using weights. To maintain diversity and to allow the process to explore the search space effectively, a system of dynamic weights is generally used.

For each circuit design, a set of specification criteria with target values or ranges may be defined as illustrated by the following set of Equations 2:

$$V_i \leq U_i$$

$$\text{or } V_i \geq L_i$$

$$\text{or } U_i \geq V_i \geq L_i \text{ for all } i=1, \ldots, n, \quad \text{(EQS. 2)}$$

where $V_i$ may be a value in the specification i, $U_i$ may be an upper limit for the specification i, $L_i$ may be a lower limit for the specification i, and n may be the number of specifications. For each of the specifications, a set of dynamic weights (e.g., $W_i$) may be defined. An initial set of weights (e.g., $W_{Init,i}$) is generally defined in the step 200 and may be set according to the preferences of the designer (e.g., between 1 for lowest priority and 4 for highest priority). At the start of the optimization process, $W_i$ may be set to $W_{Init,i}$. In various embodiments, the creation of the initial weights may occur prior to the start of the overall optimization process.

For each transistor in a circuit design, the designer may select a given region of operation (e.g., cut off, linear, saturation, triode, etc.). Therefore, another set of dynamic weights (e.g., $WR_j$, where $j=1, \ldots, m$ and m is a number of region criteria) and a set of initial weights (e.g., $WR_{Init,j}$) may be defined. The achievement of a given region or regions is generally determined through the voltages associated with a given device and not just by the discrete region itself. The process may thus be allowed to use a continuous measurement to distinguish between circuit designs rather than a pass or fail assessment.

In an initial pass of the optimization process, a candidate set of circuit designs may be simulated and results returned in the evaluation phase 104. The dynamic weighting and ranking process 106 may calculate a score in the step 202 for each circuit design based on the dynamic weights. The score may be calculated in multiple (e.g., two) parts, once for the specification criteria and once for the regions separately. The scores may subsequently be summed. A score for a given greater-than criteria of a specification may be calculated according to the following Equation 3:

$$f_i = (V_i - T_i)/(T_i - L_i), \quad \text{(EQ. 3)}$$

where $f_i$ may be an intermediate variable, $V_i$ may be the value of specification, $T_i$ may a target or ideal value (e.g., $1.15 \times L_i$), and $L_i$ may be the greater-than criteria in the specification. A score (e.g., $S_i$) may be calculated using the following Equation 4:

$$S_i = -f_i^2 \times W_i \text{ if } f_i < 0$$

$$S_i = f_i \times W_i \text{ otherwise.} \quad \text{(EQ. 4)}$$

For less-than criteria of the specifications, a score may be calculated using the following Equation 5:

$$f_i = (T_i - V_i)/(L_i - T_i), \quad \text{(EQ. 5)}$$

where $f_i$ may be an intermediate variable, $V_i$ may be the value of the specification, $T_i$ may be a target or ideal value (e.g., $0.85 \times L_i$) and $L_i$ may be the greater-than criteria of the specification. A score (e.g., $S_i$) may be calculated using the following Equation 6:

$$S_i = f_i^2 \times W_i \text{ if } f_i < 0$$

$$S_i = f_i \times W_i \text{ otherwise.} \quad \text{(EQ. 6)}$$

For range specification criteria, the target $T_i$ may be specified as a midpoint between the $L_i$ value and the $U_i$ value. If $V_i$ is less than $T_i$, Equations 3 and 4 may be used to calculate the score, otherwise the Equations 5 and 6 may be used. Other equations may be used in calculating the score to meet the criteria of a particular application. An approach is to penalize results with a quadratic function if the results fail to meet specification criteria, but use a linear reward if the results do meet the specification criteria. As such, results may be pushed toward meeting all specification criteria by discouraging solutions that may exceed a specification criterion by a relatively large amount but fail to meet another specification criteria by a relatively equally large amount.

Formulae for calculating the score for device regions generally depend upon the region specified. For a device j specified to be in saturation, the formula for an NMOS transistor is generally given by the following Equations 7:

$$p_j = VDS_j - VGS_j + VTH_j$$

$$q_j = VGS_j - VTH_j$$

$$SR_j = (p_j - q_j) \times WR_j \text{ if } p_j < 0 \text{ and } q_j > 0$$

$$SR_j = (q_j - p_j) \times WR_j \text{ if } p_j > 0 \text{ and } q_j < 0$$

$$SR_j = (p_j + q_j) \times WR_j \text{ otherwise}$$

$$\text{if } SR_j > 0, \text{ then } SR_j = SR_j^{0.1}, \quad \text{(EQS. 7)}$$

where $p_j$ and $q_j$ may be intermediate variables, $VDS_j$ may be a drain-to-source voltage on the device j, $VGS_j$ may be a gate-to-source voltage on the device j, $VTH_j$ may be a threshold voltage on the device j, $SR_j$ may be a score for the device j, and $WR_j$ may be a region weight for the device j. For a PMOS transistor, the following Equations 8 may be used:

$$p_j = |VTH_j| + VGS_j - VDS_j$$

$$q_j = -VGS_j + VTH_j$$

$$SR_j = (p_j - q_j) \times WR_j \text{ if } p_j < 0 \text{ and } q_j > 0$$

$$SR_j = (q_j - p_j) \times WR_j \text{ if } p_j > 0 \text{ and } q_j < 0$$

$$SR_j = (p_j + q_j) \times WR_j \text{ otherwise}$$

$$\text{if } SR_j > 0, \text{ then } SR_j = SR_j^{0.1}. \quad \text{(EQS. 8)}$$

For an NMOS device configured to be in a linear region, the following Equations 9 may be used:

$$p_j = VGS_j - VTH_j$$

$$q_j = -VDS_j - VGS_j + VTH_j$$

$SR_j = p_j \times WR_j$ if $p_i < 0$ and $q_i > 0$ $SR_j = (2q_j - p_j) \times WR_j$ if $pi > 0$ and $qi < 0$ $SR_j = (p_j + 2q_j) \times WR_j$ otherwise if $SR_j > 0$, then $SR_j = SR_j^{0.1}$. (EQS. 9)

For a PMOS device configured to be in the linear region, the following Equations 10 may be used:

$p_j = |VTH_j| - VGS_j$ $q_j = -|VTH_j| + VGS_j$ $SR_j = (p_j - q_j) WR_j$ if $p_i < 0$ and $q_i > 0$ $SR_j = (q_j - p_j) WR_j$ if $p_i > 0$ and $q_i < 0$ $SR_j = (p_j + q_j) WR_j$ otherwise if $SR_j > 0$, then $SR_j = SR_j^{0.1}$. (EQS. 10)

Similarly to the calculation of scores for specifications criteria, any scores for devices that are positive (e.g., the device is in the correct region) may be reduced by a power of a fraction (e.g., one tenth) less than unity. The reduction is generally designed to push devices that are in the incorrect region of operation into the correct region of operation without giving excessively high scores to devices well inside the intended region.

An overall score may be calculated as a sum of all specification scores plus a sum of all device region scores. The scores may be used to rank the entire population of circuit designs in the step 204. After the ranking, the dynamic weights may be calculated as follows. In the step 206, the top K (e.g., three) circuit designs from the ranking of all circuit designs may be selected. For each specification criterion and for each device, the results from each of the K selected circuit designs may be compared in the step 208. If the specification/region is not met, the weight may be increased by a factor (e.g., multiplied by 1.15). The factor may be chosen from experimentation as best value to use in practice. If the specification/region is met, the weight may be reduced by factor (e.g., divided by 1.15). Thereafter, the revised weights may be checked to see if any are either under the initial starting weight or above a pre-specified weight limit (e.g., 500,000). In both cases of under or over, the weight may be set to the initial weight.

Specification criteria and/or device regions that are relatively difficult to obtain relative to other specification criteria and device regions may receive a higher weight. The higher weight generally results in good or better values for such specification criteria, may be pushed higher up the list of ranked circuit designs, and may have a higher probability of contributing to the next generation of circuit designs, thus increasing a probability of good or better results for the specification criteria in the next generation. A focus of the process may be continuously changed to ensure diversity and finding a best path to a solution that meets all the specification criteria and region criteria. To avoid focusing ever more intently on a very difficult specification that is not being met, the weights for such a specification criterion may be reset after a given period of time in an attempt to focus the search on different areas of the search space.

To illustrate the dynamic weighting process, suppose there are three specifications as shown in TABLE 8 below. For each specification the requirements and the ideal targets are shown which are used to calculate the score in the step 202 for each of the ten circuits shown. In the step 200, the initial weights are given as 10. The scores are calculated according to Equations 2, 3, 4 and 5 above.

For circuit A the PSRR at DC is a less than constraint with a requirement of <−90 dB and a target of −100 dB. Thus, using Equation 4:

$F_{PSRR\ at\ DC} = (T_{PSRR\ at\ DC} - V_{PSRR\ at\ DC})/(L_{PSRR\ at\ DC} - T_{PSRR\ at\ DC})$ $F_{PSRR\ at\ DC} = (-100 - (-87))/(-90 - (-100))$ $F_{PSRR\ at\ DC} = -1.3$.

As this is less than zero the score is determined using Equation 5 as follows:

$S_{PSRR\ at\ DC} = -f_{PSRR\ at\ DC}^2 W_{PSRR\ at\ DC}$ $S_{PSRR\ at\ DC} = -(-1.3)^2 * 10$ $S_{PSRR\ at\ DC} = -16.9$.

The score component for VREG sleep mode for circuit A can be calculated similarly using Equations 2 and 5 to give a score of 0.75. The score column in TABLE 8 shows the total scores for each circuit. If regions of operations are being considered then the scores for each circuit would also include the scores calculated in Equations 6 and 7 for each device added to the total score. These scores are used to rank the circuits in the step 204, from highest to lowest score as shown in TABLE 9.

TABLE 8

| | Specification | | | |
| --- | --- | --- | --- | --- |
| | PSRR at DC <−90 dB Target 100 dB | VREG sleep mode >1.6 V Target 2 V | VREG max >2.15 V, <2.25 V Target 2.2 V | Score |
| Specification weight | 10 | 10 | 10 | |
| Circuit A | −87 dB | 1.7 V | 2.3 V | −49.4 |
| Circuit B | −70 dB | 1.4 V | 2.0 V | −235 |
| Circuit C | −105 dB | 1.5 V | 2.2 V | 17.5 |
| Circuit D | −97 dB | 1.6 V | 2.3 V | −30.9 |
| Circuit E | −81 dB | 1.8 V | 2.4 V | −191.1 |
| Circuit F | −55 dB | 1.7 V | 2.1 V | −235 |
| Circuit G | −72 dB | 1.2 V | 2.2 V | −58.4 |
| Circuit H | −98 dB | 1.5 V | 2.2 V | 12.1 |
| Circuit I | −86 dB | 1.7 V | 2.3 V | −52.1 |
| Circuit I | −50 dB | 1.9 V | 2.2 V | −247.5 |

TABLE 9

| | Specification | | | |
| --- | --- | --- | --- | --- |
| | PSRR at DC <−90 dB Target 100 dB | VREG sleep mode >1.6 V Target 2 V | VREG max >2.15 V, <2.25 V Target 2.2 V | Score |
| Specification weight | 5.12 | 12.5 | 8 | |
| Circuit C | −105 dB | 1.5 V | 2.2 V | 17.5 |
| Circuit H | −98 dB | 1.5 V | 2.2 V | 12.1 |
| Circuit D | −97 dB | 1.6 V | 2.3 V | −30.9 |
| Circuit A | −87 dB | 1.7 V | 2.3 V | −49.4 |
| Circuit I | −86 dB | 1.7 V | 2.3 V | −52.1 |
| Circuit G | −72 dB | 1.2 V | 2.2 V | −58.4 |
| Circuit E | −81 dB | 1.8 V | 2.4 V | −191.1 |
| Circuit B | −70 dB | 1.4 V | 2.0 V | −235 |
| Circuit F | −55 dB | 1.7 V | 2.1 V | −235 |
| Circuit I | −50 dB | 1.9 V | 2.2 V | −247.5 |

In step 206 the top K circuits are selected. A typical value for K is 3. Then, for each specification and each of the selected circuits the weight for that specification is adjusted depending on whether the circuit has met the requirement. The adjustment is geometric and the factor used is typically chosen at 1.25. Thus for PSRR at DC the comparisons and decisions are as follows:

Circuit C −105 dB has met the requirement of <−90 dB=>weight is reduced by a factor of 1.25=8;
Circuit H −98 dB has met the requirement of <−90 dB=>weight is reduced by a factor of 1.25=6.4; and
Circuit D −97 dB has met the requirement of <−90 dB=>weight is reduced by a factor of 1.25=5.12.

For the VREG sleep mode the comparisons are:

Circuit C 1.5V has not met the requirement of >1.6V=>weight is increased by a factor of 1.25=12.5;
Circuit H 1.5V has not met the requirement of >1.6V=>weight is increased by a factor of 1.25=15.625; and
Circuit D 1.6V has met the requirement of >1.6V=>weight is reduced by a factor of 1.25=12.5.

A Similar calculation may be performed for the VREG max specification to give a new weight of 8. In the next generations of the process these revised weights are used to calculate scores and rank circuits. Adjustment of regions of operation weights follows the same logic.

Figure 7:
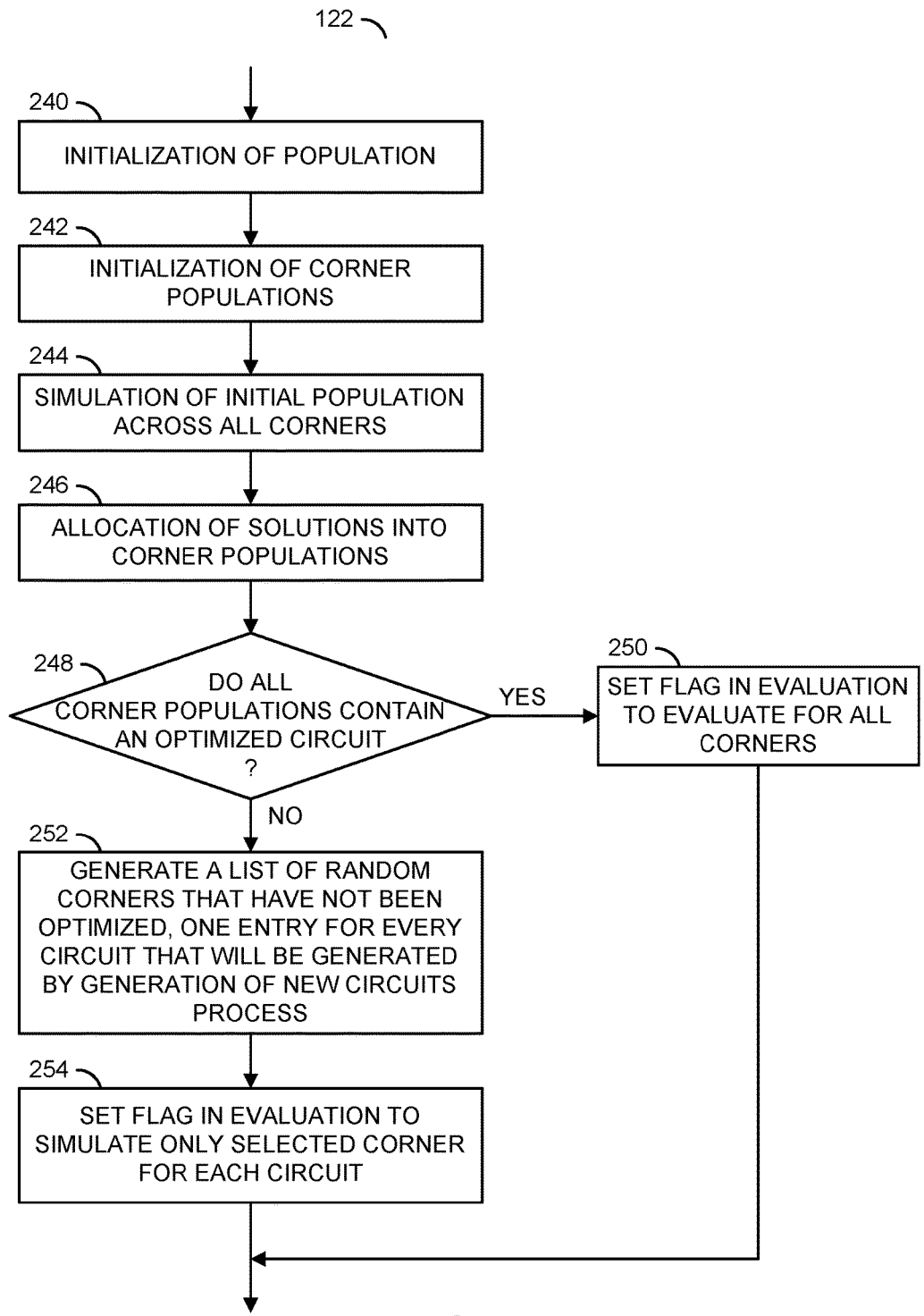
FIG. 7 is a detailed flow diagram illustrating a corner process.

Referring to FIG. 7, a detailed flow diagram of an example implementation of the corner process 122 is shown. The method (or technique or process) 122 may be implemented in the system 50 or the system 80 via computer software and/or a machine performing the software steps. The method 122 generally comprises a step (or state) 240, a step (or state) 242, a step (or state) 244, a step (or state) 246, a decision step (or state) 248, a step (or state) 250, a step (or state) 252, and a step (or state) 254.

The method 122 generally provides an optimization across process, voltage and temperature (PVT) corners without evaluating every PVT corner. In the step 240, an initialization of the population may be performed. Prior to the start of the overall process a set of corner populations (e.g., a population for each PVT corner) may be created in the step 242. The initial population of circuit designs generated from the initialization step 102 may be simulated across all PVT corners in the step 244 and allocated into each of the corner populations in the step 246. Thus, each corner population may contain the same set of circuit designs.

After the initialization, the overall process 100 generally enters the corner process 122. In embodiments implementing the optional matching matrix, entry to the process 122 is from the matching matrix process 128. For each corner population, if at least a single circuit design exists that satisfies all the electrical specifications and device regions for that corner per the decision step 248, the process 100 may continue with the generation of the new circuit designs using the process 110 in FIG. 4, and set a flag in the step 250 for the evaluation step 104 to simulate across all circuit designs. The circuit designs may be ranked according to the dynamic ranking and weighting process 106 for each PVT corner, and summed over all PVT corners. The loop generally continues until optimization across all circuit designs is achieved.

If at least one corner population does not contain an optimized circuit for that corner per the decision step 248, a list with a same length as the number of new circuit designs to be created in the generate new circuits process 110 may be created in the step 252. The list generally contains a random selection of the corner populations that do not contain an optimized circuit design. A flag is also set in the step 254 for the evaluation step 104 to simulate each circuit design only for the selected corner. Similarly when passing to the generate new circuit designs process 110, the main population may be replaced by the selected corner population.

To demonstrate the functioning of the corner process 122, an example is shown in TABLE 10. In this example there are 2 corners: a Nominal corner and a Slow corner. TABLE 10 shows the results in step 244 from simulation of all corners for five circuits following on from the initialization of the population.

TABLE 10

| | | Specification | | |
|---|---|---|---|---|
| | Corner | PSRR at DC <−90 dB Target 100 dB | VREG sleep mode Target >1.6 V Target 2 V | VREG max >2.15 V, <2.25 V Target 2.2 V |
| Circuit A | Nominal | −87 dB | 1.7 V | 2.3 V |
| | Slow | −83 dB | 1.6 V | 2.0 V |
| Circuit B | Nominal | −105 dB | 1.5 V | 2.2 V |
| | Slow | −97 dB | 1.6 V | 2.3 V |
| Circuit C | Nominal | −61 dB | 1.8 V | 2.4 V |
| | Slow | −55 dB | 1.7 V | 2.1 V |
| Circuit D | Nominal | −88 dB | 1.2 V | 2.2 V |
| | Slow | −98 dB | 1.5 V | 2.2 V |
| Circuit E | Nominal | −86 dB | 1.7 V | 2.3 V |
| | Slow | −50 dB | 1.9 V | 2.2 V |

In the step 242, two new populations are created each one representing each of the two corners. Thus, there are now four populations: the breeding population for storing circuits prior to simulation; the overall population which contains circuits that have been simulated across all corners; the Nominal population that contains circuits that have been simulated for the Nominal corner; and, the Slow corner population containing circuits that have been simulated for the Slow corner. The Nominal and Slow corner populations are collectively referred to as the corner populations. In the step 246, the simulated circuits are allocated into the respective populations. Every circuit shown in TABLE 10 will enter into the overall, Nominal and Slow populations.

In the step 248, each of the corner population is checked for optimized circuits. For the results in TABLE 10, neither the Nominal or Slow corners contain an optimized circuit. Therefore, the process 122 proceeds to the step 252 which creates a list of corners such that new circuits entering the breeding population will only be simulated for a given corner. This is shown in TABLE 11 together with some hypothetical results. These new circuits will be placed into either the Nominal or Slow populations but not both as each has results for only one corner simulated.

TABLE 11

| | | Specification | | |
|---|---|---|---|---|
| | Corner | PSRR at DC <−90 dB Target 100 dB | VREG sleep mode Target >1.6 V Target 2 V | VREG max >2.15 V, <2.25 V Target 2.2 V |
| Circuit E | Nominal | −91 dB | 1.7 V | 2.2 V |
| | Slow | Not simulated | Not simulated | Not simulated |

TABLE 11-continued

| | | Specification | | |
|---|---|---|---|---|
| | Corner | PSRR at DC <−90 dB Target 100 dB | VREG sleep mode >1.6 V Target 2 V | VREG max >2.15 V, <2.25 V Target 2.2 V |
| Circuit F | Nominal | Not simulated | Not simulated | Not simulated |
| | Slow | −95 dB | 1.5 V | 2.3 V |
| Circuit G | Nominal | Not simulated | Not simulated | Not simulated |
| | Slow | −78 dB | 1.7 V | 2.1 V |
| Circuit H | Nominal | −92 dB | 1.4 V | 2.2 V |
| | Slow | Not simulated | Not simulated | Not simulated |
| Circuit I | Nominal | −93 dB | 1.7 V | 2.3 V |
| | Slow | Not simulated | Not simulated | Not simulated |

As can be seen, circuit E is optimized for the Nominal corner. Circuit E will then be simulated for the Slow corner and will also be placed into the Slow corner population and the overall population. In the next iteration of the process, only the Slow corner will be simulated as the Nominal corner population contains an optimized result. The process continues until all corner populations contain at least one optimized solution. Once this is achieved, all corners for each circuit in the breeding population are simulated.

Figure 8:
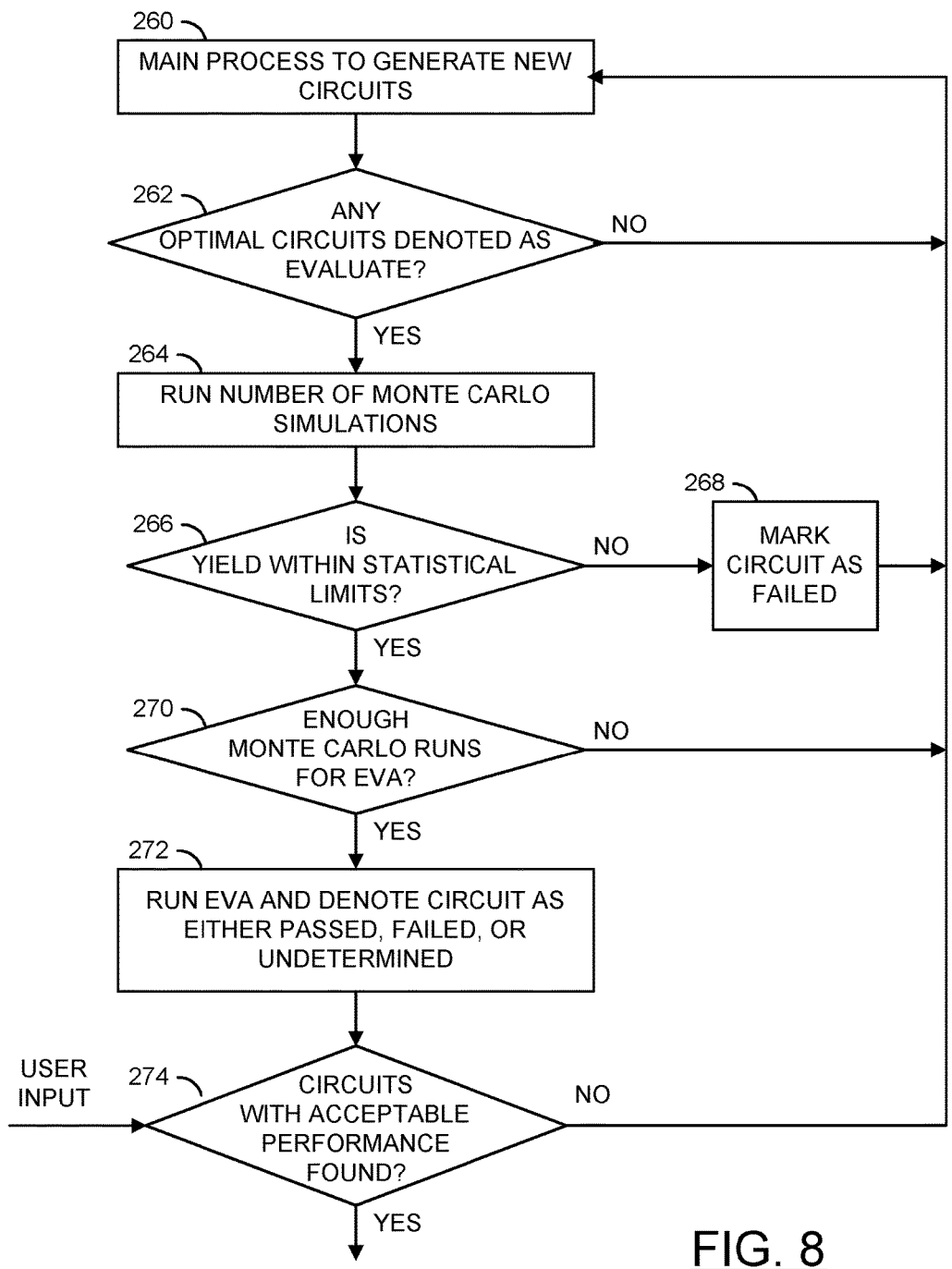
FIG. 8 is a detailed flow diagram illustrating a yield process.

Referring to FIG. 8, a detailed flow diagram of an example implementation of the yield process 124 of FIG. 4 is shown. The method (or technique or process) 124 may be implemented in the system 50 or the system 80 via computer software and/or a machine performing the software steps. The yield process 124 may be used to optimize a yield (or minimize a failure rate) of a circuit design. A statistical (e.g., Monte Carlo) simulation generally operates by varying the process parameters associated with a circuit design based on one or more predetermined statistical distributions. If the circuit design fails to meet the electrical specifications for a given simulation, the circuit design may be considered as a failure, otherwise the design may be successful. The yield is generally taken as a percentage of successful simulations. The yield may be measured overall by consideration of all specification criteria or partial by consideration of individual specification criterions. The yield process 124 may be triggered if an optimal solution (e.g., typical or PVT) exists that has not yet failed or passed the yield process. In embodiments implementing the optional matching matrix, the yield process 124 may be triggered after the matching matrix process 128.

The method 124 generally comprises a step (or state) 260, a step (or state) 262, a step (or state) 264, a step (or state) 266, a step (or state) 268, a step (or state) 270, a step (or state) 272, and a step (or state) 274. In the step 260, the process 124 may receive circuit solutions from the main process for generating new circuits. Any new solution is generally marked evaluation (e.g., "EVALUATE"). Each circuit design may be checked in the decision step 262 for denotation as EVALUATE. For any optimal circuit design marked EVALUATE, a small number Monte-Carlo simulations may be performed and a yield measured in the step 264. If the circuit design has already been through the step 264 before, the Monte Carlo runs may be added to previous runs. As more runs are added, the number added each time generally increases. If the yield of the circuit design is below a statistical threshold, determined in the decision step 266 (e.g., using a binomial test), the circuit design may be denoted as failed in the step 268. If the yield is sufficiently high per the decision step 266, the circuit design may be retained.

Once a sufficient number of Monte Carlo simulations have built up for a given circuit design per the decision step 270, the given circuit design may be evaluated using an extreme value analysis (e.g., EVA). In the step 272, the EVA may determine an upper confidence interval and a lower confidence interval for the yield. If the electrical specification evaluation falls below the lower confidence limit, the solution may be deemed to have achieved the yield for a given confidence level. If the evaluation falls above the upper limit, the circuit design has failed. If the evaluation falls between the lower extreme and upper extremes, the solution may be considered undetermined and retained for more Monte-Carlo simulations and testing. In the step 274, the user (designer) may provide input determining whether the process 124 stops or continues to loop. Following the yield process 124, the generate new circuits process 110 may be commenced. Additionally the yield process 124 may be used for validation of a single circuit design in a normal manner by testing at intervals.

To demonstrate the yield process 124, suppose there are two optimized circuits that have yet to run any Monte Carlo simulations; circuits A and B. In the step 260, both circuits A and B would be directed to the step 262 and a number of Monte Carlo runs will be simulated. In one example, the number of runs may be 10. After simulation, suppose that circuit A has a recorded yield of 70% and that circuit B has a yield of 100%. Further suppose that the target yield is 99.86% which corresponds to the standard 3-sigma requirement. Using appropriately calculated confidence intervals for each circuit, circuit A is denoted as failed and circuit B is denoted as undetermined. Circuit A would therefore not need any more Monte Carlo simulations and circuit B would add another 10 Monte Carlo runs. At each addition of new Monte Carlo runs circuit B would be tested for statistical validity. If circuit B is not failed and has enough Monte Carlo runs (e.g., greater than 1000), the Extreme Value Analysis is used to access the circuit. The result of this analysis could be passed, failed or undetermined. If undetermined more Monte Carlo runs will be added to the circuit. Otherwise, if the circuit is passed or failed no more Monte Carlo simulations will be added.

Figure 9:
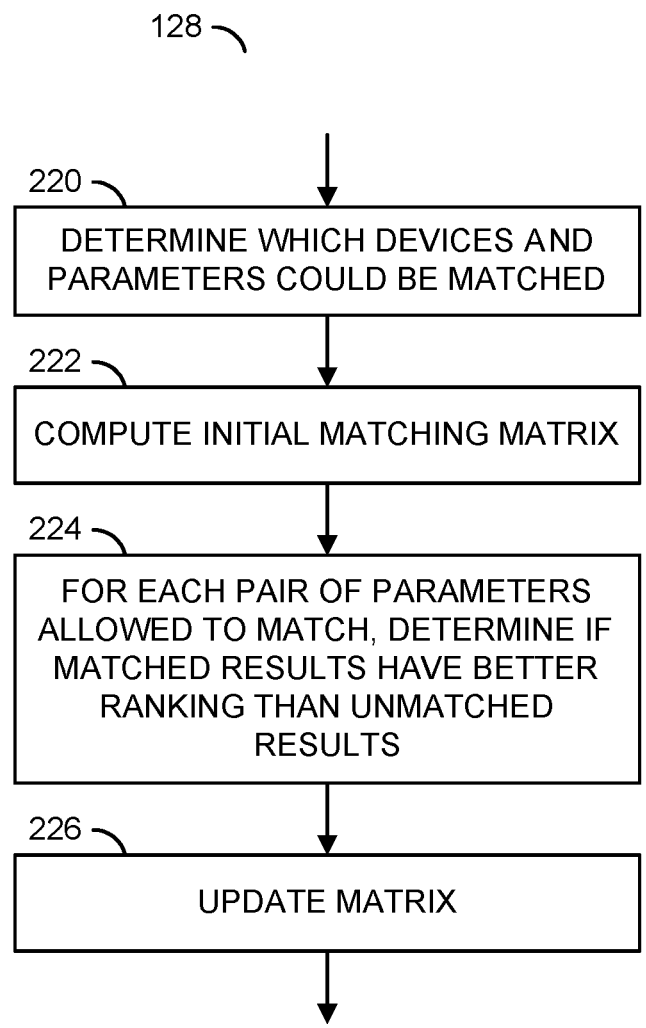
FIG. 9 is a detailed flow diagram illustrating an optional matching matrix process.

Referring to FIG. 9, a detailed flow diagram illustrating an example implementation of the optional matching matrix method 128 of FIG. 4 is shown. The method (or technique or process) 128 may be implemented in the system 50 or the system 80 via computer software and/or a machine performing the software steps. In many situations, good solutions to a problem may be found if some devices are matched. That is, the lengths, widths and other parameters of the various devices are the same (or sufficiently similar to be considered the same). The designer generally specifies which devices are matched. However, some potentially beneficial matching may be missed by the designer. Therefore, a probability matrix may be used to help match devices.

In various embodiments, the method 128 generally comprises a step (or state) 220, a step (or state) 222, a step (or state) 224, and a step (or state) 225. In the step 220 (which may occur before the overall process commences), the devices in a circuit design that can be matched may be identified. Devices within a given sub-circuit and of a given family (e.g., NMOS, PMOS, resistor, etc.) are generally matched with other devices in the given family. From the matching, an initial probability matrix may be calculated in the step 222. For each pair of devices that may be matched, each of the corresponding parameters may receive a probability entry in the matrix of a predetermined value (e.g., 0.1). All other entries may be zero. TABLE 12 generally illustrates an example matching matrix between a transistor device M1 and a transistor device M2.

TABLE 12

|  |  | Transistor Device M1 | | | Transistor Device M2 | | |
| --- | --- | --- | --- | --- | --- | --- | --- |
|  |  | Length | Width | M Param | Length | Width | M Param |
| Trans. | Length | 0 | 0 | 0 | 0.1 | 0 | 0 |
| Device | Width | 0 | 0 | 0 | 0 | 0.1 | 0 |
| M1 | M Param. | 0 | 0 | 0 | 0 | 0 | 0.1 |
| Trans. | Length | 0.1 | 0 | 0 | 0 | 0 | 0 |
| Device | Width | 0 | 0.1 | 0 | 0 | 0 | 0 |
| M2 | M Param. | 0 | 0 | 0.1 | 0 | 0 | 0 |

Following from the dynamic weighting and ranking process 106, the results may be analyzed in the step 224. For each particular pair of parameters that may be matched, the population of circuit designs may be divided into two groups: the circuit designs that are matched for the particular pair of parameters, and the circuit designs that are not matched. If both groups are sufficiently large for statistical comparison, a Wilcoxon Signed Rank test may be performed in the step 224 to ascertain whether the matched group is typically higher ranked than the unmatched group. If the result is statistically significant, the probability of the two parameters being matched may be increased. If the result is not significant, the probability may be reduced. Limits are generally imposed on a minimum probability (e.g., 0.1) and a maximum probability (e.g., 0.9) of matching.

In the step 226, the matching matrix may be updated based on the results. Following the updating of the matching matrix, the generation of new circuit designs may be performed. The generation of the new circuit designs may be focused on the corner yield or yield process. During the generation of the new circuit design process, each new circuit design may be matched with the probability given in the matching matrix.

Figure 10:
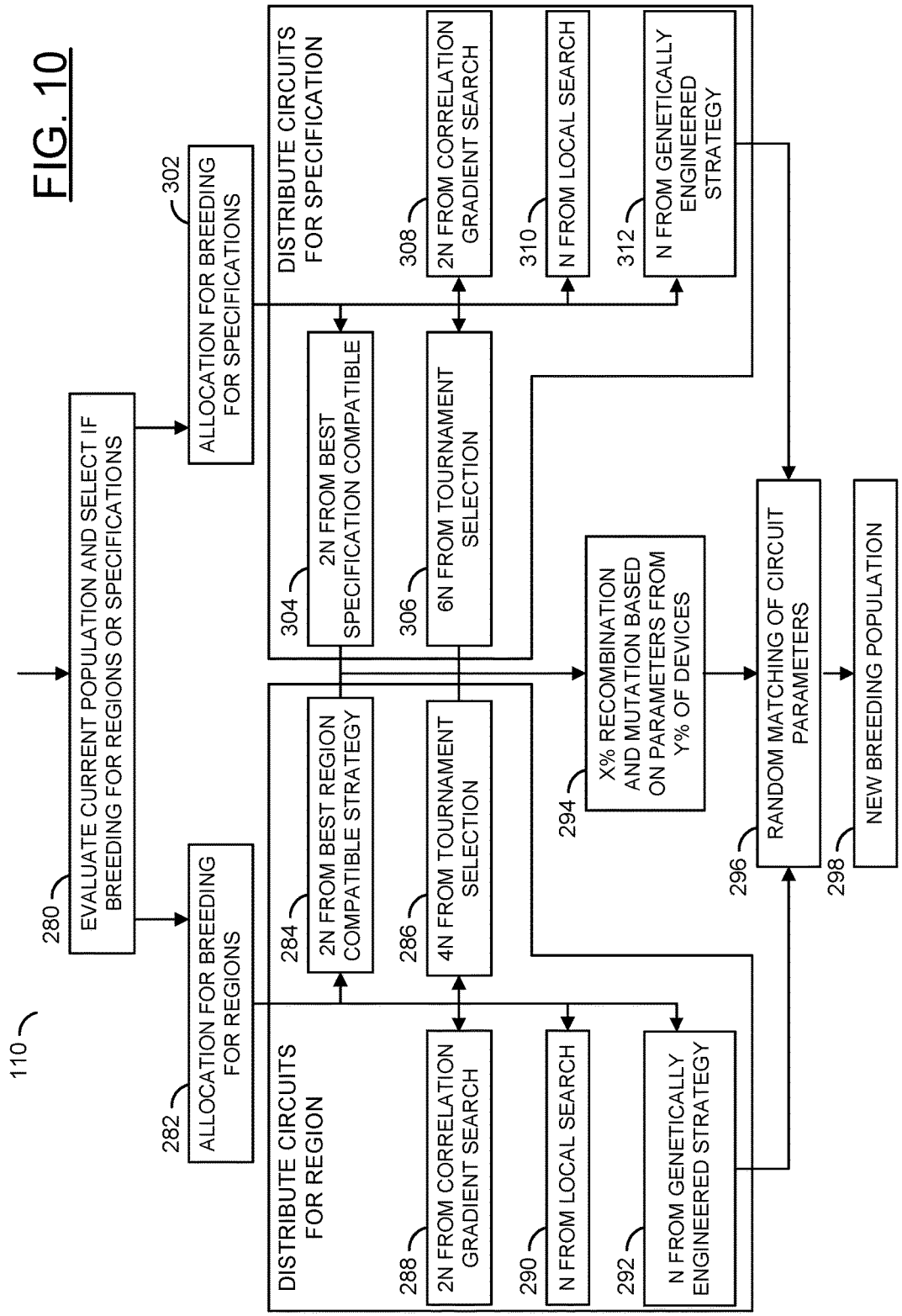
FIG. 10 is a detailed flow diagram illustrating a new circuit design generation process.

Referring to FIG. 10, a detailed flow diagram illustrating an example implementation of the new circuit design generation process 110 of FIG. 4 is shown. The method (or technique or process) 110 may be implemented in the system 50 or the system 80 via computer software and/or a machine performing the software steps. The process 110 generally provides a set of new circuit designs for simulation in a next generation or breeding population. The process 110 may use one or more methods to ensure diversity and to explore good solutions locally and globally.

In various embodiments, the method 110 generally comprises a step (or state) 280, a step (or state) 282, a step (or state) 284, a step (or state) 286, a step (or state) 288, a step (or state) 290, a step (or state) 292, a step (or state) 294, a step (or state) 296, a step (or state) 298, a step (or state) 300, a step (or state) 302, a step (or state) 304, a step (or state) 306, a step (or state) 308, a step (or state) 310, a step (or state) 312, a step (or state) 314, and a step (or state) 316. In the step 280, the process 110 may evaluate a current population and select whether breeding is to be performed for regions or for specifications. When breeding for regions, the process 110 moves to the step 282. When breeding for specifications, the process 110 moves to the step 302.

In the step 282, the process 110 allocates circuit for breeding based on region using the steps 284 through 292.

In the step 302, the process 110 allocates circuit for breeding based on specification using the steps 304 through 312. In the steps 284 and 304, a compatibility selection may account for the generation of several (e.g., 2N out of a total number (e.g., 10N) of new circuit designs (where N may be 4). In the steps 286 and 306, a normal tournament selection may account for the generation of several (e.g., 4N in the step 286, 6N in the step 306) out of a total number (e.g., 10N) of new circuit designs (where N may be 4). In the steps 288 and 308, a correlation gradient search may account for the generation of several (e.g., 2N) out of the total number 10N of new circuit designs entering the breeding population. In the steps 290 and 310, a normal local search based on perturbing the parameter values of the top solutions by small amount may account for the generation of several (e.g., N) out of the total number 10N of new circuit designs entering the breeding population. In the steps 292 and 312, a genetically engineered strategy may account for the generation of several (e.g., N) out of the total number 10N of new circuit designs entering the breeding population.

In the step 294, circuit designs generated using the tournament strategy or best compatible strategy (e.g., steps 284, 286, 304, and 306) may use recombination and mutation in a normal method. Some random percentage Y (e.g., half) of the circuit designs may select X percentage (e.g., 50%) of the parameters from entire devices to recombine rather than individual parameters. In the step 296, a random matching of parameters may be performed using the genetically engineered strategy or recombination and mutation (e.g., steps 292, 294, and 312). In the step 298, the new circuits enter the breeding population which contains all circuits awaiting simulation. Upon completion of the process 110, the method 100 may continue with the process 104 to evaluate the new circuit designs.

The generation of new circuit designs process 110 may be initiated after the dynamic weighting and ranking process 106 if nominal optimization is intended. In embodiments implementing the optional matching matrix, the generation of new circuit designs process 110 may be initiated after the matching matrix process 128 if nominal optimization is intended. If the corner process 122 and/or the yield process 124 are intended, the corner process 122 and/or the yield process 124 may be performed prior to generating the new circuit designs using the process 110. Once finished, the breeding population, which is generally the set of circuit designs generated, may be passed on to the evaluation process 104 within the overall method 100.

Each circuit design may be considered as a set of parameters related to the dimensions of each device in the respective circuit design. Other generic parameters may be considered as a set of results for the specifications and the transistor device regions. Thus, a circuit design (e.g., C) may contain:

Pi i=1, ..., n a set of n parameters
Sj j=1, ..., m a set of m specifications
Rk k=1, ..., r a set of r regions of operation
Dl l=1, ..., d a set of d discrete level parameters.

The parameters may be allowed to vary between an upper limit and a lower limit, and take values at discrete, regular intervals defined by a granularity. A Euclidean distance (e.g., $d_{ab}$) between two circuits $C_a$ and $C_b$ may be defined by the following Equation 11:

$$d_{ab} = \left( \sum_{i=0}^{n} (P_{ai} - P_{bi})^2 \right)^{1/2} \quad (EQ. 11)$$

A specification criterion generally has either or both of an upper limit $U_i$ and a lower limit $L_i$. A circuit design may be said to have satisfied a specification criterion if the value for the specification criteria is greater than the lower limit and less than the upper limit. In a case where only a single limit is applicable, the circuit design may satisfy the specification criteria if the value satisfies the single limit.

In the step 280, the circuit designs for which there are solutions may be evaluated. Selection of new circuit designs may be focused either on meeting regions or meeting specifications. A rule used in practice may be that every other generation uses the specification-based breeding strategy and the choice of strategies for the remaining generations are dependent upon a few (e.g., 2) out of the top several (e.g., 5) solutions meeting all device region criteria for the use the specification-breeding strategy.

In embodiments implementing the option matching matrix process 128, the matching matrix may be used to a priori match parameters for each new circuit design before generation. The matching matrix generally provides a probabilistic framework to match parameters. If a pair of parameters is selected for matching, the new circuit design may contain the same value for the matched parameters.

If discrete level parameters are present, prior to performing a best region/specification strategies (e.g., the steps 284 and 304) or the tournament selection (e.g., the steps 286 and 306), an initial phase may be performed in the steps 282 and 302 to reorder the population of circuit designs. The reordering may facilitate the selection of suitable parents. While the levels of the parameters may be numeric, if a large gap exists between the values the parameters may be considered as disjointed with no smooth relationship between the changes in value and the electrical specifications.

In one example, the procedure may be as follows. From the population that has been ranked according to the dynamic weighting and ranking process 106, two circuit designs may be selected from the top circuit designs (e.g., typically the top 30). In some embodiments, a weighted selection may be used for the selection. In other embodiments, a random selection may be used. A recombination and mutation process may be performed for the two circuit designs for the discrete parameters. Thus, if two discrete parameters both have four levels A, B, C and D, a circuit design may have AB selected for the parameters and another circuit design may have CD. After recombination, the selection may be AD, and after mutation BD. For every circuit design in the population, a matching score may be provided such that the score is the total number of discrete parameters that match the selection. Thus, CD may score 2, CA may score 1 and BB may score 0 etc. The population may be ranked using the score such that the circuit designs with the highest scores appear at the top of the population. Thereafter, the population may be ranked by the original ranking system. Continuing with the above example, all circuit designs with CD may be at the top of the population and then ranked according the original ranking process. The revised population may be used for selection of the parents.

In various embodiments, the best region compatible strategy (e.g., the step 284) and a best specification compatible strategy (e.g., the step 304) may operate as follows. Select at random a circuit design from the top twenty solutions. For every other circuit design in the population, a new idealistic hybrid circuit design may be constructed by taking the best specification of the two circuit designs or best regions. Taking two circuits $C_a$ and $C_b$, a new idealistic circuit (e.g., $C_{Ideal}$) may be constructed thus:

For each specification S (j=1, ..., m), $S_{Ideal,j} = \max_{spec,j}(S_{a,j}, S_{b,j})$, where $\max_{spec,j}$ may represent a function that selects the best value with respect to specification j from a list of values.

For each region $R_k$ (k=1, ..., r), $R_{Ideal,r} = \max_{region,r}(R_{a,r}, R_{b,r})$, where $\max_{region,r}$ may represent a function that selects the best value with respect to a given region r criterion from a list of values. Parameters may be omitted as the specifications and regions may be of interest in the construction.

A resulting list of idealistic circuit designs may be ranked using the dynamic weighting and ranking process 106. A solution may be chosen from the top several (e.g., ten) circuit designs, and the two circuit designs that formed the idealistic circuit design, may be chosen for recombination and mutation to produce a new circuit design for simulation in the breeding population. Mutation and recombination may be performed using a normal approach.

In various embodiments, the correlation gradient search (e.g., step 288) works as follows. For each of the 2N highest ranked solutions, determine a nearest group (e.g., 30) of neighbors based on the Euclidean distance. Calculate a correlation matrix among the parameter values of the (e.g., 31) circuit designs and the specifications. A correlation (e.g., $C_{ij}$) between parameter i and specification j may be calculated using the following Equation 12:

$$c_{ij} = \frac{\sum_{t=1}^{31} (P_{i,t} - \overline{P}_i)(S_{j,t} - \overline{S}_j)}{\left[ \sum_{t=1}^{31} (P_{i,t} - \overline{P}_i)^2 \sum_{t=1}^{31} (S_{j,t} - \overline{S}_j)^2 \right]^{1/2}} \quad (EQ. 12)$$

where $P_{i,t}$ may be a value of the $i^{th}$ parameter for the $t^{th}$ circuit, $S_{j,t}$ may be a value of the $j^{th}$ specification for the $t^{th}$ circuit, $\overline{P}_i$ may be a mean value of the $i^{th}$ parameter, and $\overline{S}_j$ may be a mean value of the $j^{th}$ specification.

The input parameters for a new circuit design (e.g., $C_{new}$) may be calculated using the following Equation 13:

$$P_{new,i} = P_i + \sum_{j=1}^{m} c_{ij} D \quad (EQ. 13)$$

where D represents a step size. The step size may be computed by finding $D_{max}$ such that a resulting $P_{max\_new}$ is on the edge of the search space defined by the ranges of device parameters. A random number (e.g., r) between two bounds (e.g., 0.67 and 6) may be chosen and $D=D_{max}/r$. A new circuit design may thus reside outside the permissible values for a given parameter.

The new circuit designs may be made discrete such that the parameters take a discrete value with respect to the granularity of the parameter by rounding. Any parameter that falls outside a permissible range may be changed to either the upper limit or the lower limit, depending on which bound is violated.

The genetically engineered (e.g., GenEd) method (e.g., the steps 296 and 316) may work as follows. For each specification criterion, select the highest ranked circuit designs that satisfy the specification criterion. If fewer than a few (e.g., 5) such circuit designs exist, the specification criteria may be ignored for the rest of this method. The number of circuits chosen may be limited to the Z highest ranked solutions in the population (e.g., Z=30) if the population has more than Z circuit designs. For each parameter and each specification for which enough circuit designs have been selected, compute the standard deviations $SD_{i,j}$ and medians $MED_{i,j}$. For each parameter i, find the smallest $SD_{i,j}$ and set the value of the new circuit design to $MED_{i,j}$. The parameter values in the new circuit design may be perturbed. Furthermore, the step 110 may be performed using either the current dynamic weights or initial weights (e.g., described above in connection with the dynamic weighting and ranking process 106.

In the step 280, the decision is made to generate new circuits based on the requirement to satisfy region of operation requirements or specification requirements. If the first N (e.g., 10) solutions selected from the overall population (includes every circuit that has been simulated) does not contain at least M (e.g., 3) circuits that have satisfied all the region of operation requirements from the block 114 and the generation is an even number, new solutions will be generated to satisfy region of operation requirements, and the process 110 moves to the step 282. Otherwise the circuits will be generated to satisfy the specification requirements, and the process 110 moves to the step 302.

Circuits generated to satisfy region of operation requirements are distributed proportionately according to blocks 284, 286, 288, 290 and 292 in a ratio of 2:4:2:1:1. However, this ratio may be changed. Circuits generated from blocks 284 and 286 undergo recombination and mutation in the step 294. Similarly circuits generated for satisfying specification requirements are proportionately distributed according to blocks 304, 306, 308, 310 and 312. Circuits generated from blocks 304 and 306 undergo recombination and mutation in the step 294. All circuits are subject to the step 296 and are randomly selected with probability p (e.g., p=0.33) to undergo matching of device parameters. After generation the new circuits enter the breeding population (e.g., the step 298), which contains all circuits awaiting simulation. Once simulated, the circuits join the overall population.

The random matching of circuit parameters in step 296 may be done as follows. It is advantageous to use the same dimensions for some similar devices in a circuit, both in terms of performance with respect to meeting specification and region of operation requirements and for subsequent layout of a circuit. Following the procedures described in blocks 282-294 and 302-312, the step 296 will, for each circuit, decide randomly if a circuit is to have its parameters matched. The term matching is defined as setting the parameters of different devices to be equal or in a discrete ratio. Typically the ratios used are 1:1, 1:2, 1:3 and 2:3. However, other ratios may be used to meet the design criteria of a particular application. Only equivalent parameters can be matched. For example, the lengths of two PMOS devices may be matched, but not the length parameter of a capacitor to the width of a resistor. The rule for matching such parameters is to test if the values are within 10% of any of the ratios above. The procedure is to start with the first device in the list and test for matching with each subsequent parameter, then select the second parameter in the list and match with each subsequent parameter. TABLE 13 shows an example of a circuit that has been randomly selected for matching at the start of the process.

TABLE 13

| Device type | Device name | Parameter name | Value |
| --- | --- | --- | --- |
| PMOS | PM1 | PM1_Length | 4.8 um |
|  |  | PM1_Width | 2.3 um |
| PMOS | PM2 | PM2_Length | 5.0 um |
|  |  | PM2_Width | 4.4 um |
| PMOS | PM3 | PM3_Length | 0.9 um |
|  |  | PM3_Width | 0.58 um |
| Capacitor | C1 | C1_Length | 5 um |
|  |  | C1_Width | 7 um |

Step 1: select parameter PM1_Length and compare to subsequent parameters
  PM1_Length with PM1_Width→no match as comparing length to width→do not change
  PM1_Length with PM2_Length→devices are both PMOS, both parameters are length, 5 um is within 10% of 4.8 um based on 1:1 ratio→set PM2_Length=4.8 um
  PM1_Length with PM2_Width→no match as comparing length to width→do not change
  PM1_Length with PM3_Length→devices are both PMOS, both parameters are length, 0.9 um is no within 10% of 4.8 um based on any ratio→do not change
  PM1_Length with PM3_Width→no match as comparing length to width→do not change
  PM1_Length with C1_Length→no match as comparing different devices→do not change
  PM1_Length with C1_Width→no match as comparing different devices→do not change
TABLE 14 shows result of the above step 1.

TABLE 14

| Device type | Device name | Parameter name | Value |
| --- | --- | --- | --- |
| PMOS | PM1 | PM1_Length | 4.8 um |
|  |  | PM1_Width | 2.3 um |
| PMOS | PM2 | PM2_Length | 4.8 um |
|  |  | PM2_Width | 4.4 um |
| PMOS | PM3 | PM3_Length | 0.9 um |
|  |  | PM3_Width | 0.58 um |
| Capacitor | C1 | C1_Length | 5 um |
|  |  | C1_Width | 7 um |

Step 2: select parameter PM1_Width and compare to subsequent parameters
  PM1_Width with PM2_Length→no match as comparing length to width→do not change
  PM1_Width with PM2_Width→devices are both PMOS, both parameters are width, 4.4 um is within 10% of 2.3 um based on 2:1 ratio→set PM2_Width=4.6 um
  PM1_Width with PM3_Length no match as comparing length to width→do not change
  PM1_Width with PM3_Width→devices are both PMOS, both parameters are length, 0.9 um is no within 10% of 4.8 um based on any ratio→do not change PM1_Width with C1_Length→no match as comparing different devices→do not change
PM1_Width with C1_Width→no match as comparing different devices→do not change This procedure is repeated up and including the penultimate parameter. There are no other matches so the final circuit would contain the parameter values shown in TABLE 15.

TABLE 15

| Device type | Device name | Parameter name | Value |
|---|---|---|---|
| PMOS | PM1 | PM1_Length | 4.8 um |
|  |  | PM1_Width | 2.3 um |
| PMOS | PM2 | PM2_Length | 4.8 um |
|  |  | PM2_Width | 4.6 um |
| PMOS | PM3 | PM3_Length | 0.9 um |
|  |  | PM3_Width | 0.58 um |
| Capacitor | C1 | C1_Length | 5 um |
|  |  | C1_Width | 7 um |

The functions and structures illustrated in the diagrams of FIGS. 1-8 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors. As used herein, the term "simultaneously" is meant to describe events that share some common time period but the term is not meant to be limited to events that begin at the same point in time, end at the same point in time, or have the same duration.

While the invention has been particularly shown and described with reference to embodiments thereof, it will be understood by those skilled in the art that various changes in form and details may be made without departing from the scope of the invention.

The invention claimed is:

1. A method for analog circuit design, comprising the steps of:
   (A) evaluating an initial population comprising a plurality of initial designs of an analog circuit using a computer to determine to breed a plurality of new designs that either (i) satisfy one or more regions of operation or (ii) satisfy one or more specification criteria;
   (B) selecting a plurality of subsets of said initial designs based on a plurality of first techniques and one or more second techniques to establish a plurality of selected designs, wherein a size of each subset selected by said first techniques and said second techniques is based on said determination to satisfy said regions of operation or said specification criteria;
   (C) recombining some of said selected designs established by said first techniques to generate a plurality of recombined designs;
   (D) mutating some of said recombined designs to generate a plurality of mutated designs;
   (E) matching a plurality of circuit parameters of said mutated designs and said selected designs established by said second techniques to generate said new designs and
   (F) generating a design file of at least one of said new designs, wherein a plurality of chips are fabricated using said design file.

2. The method according to claim 1, wherein said first techniques to breed based on said regions of operation comprise (i) a best compatible region strategy and (ii) a tournament selection strategy.

3. The method according to claim 1, wherein said first techniques to breed based on said specification criteria comprise (i) a best compatible specification strategy and (ii) a tournament selection strategy.

4. The method according to claim 1, further comprising the step of:
   searching said initial population with a correlation search technique to determine one or more of said new designs.

5. The method according to claim 1, further comprising the step of:
   searching said initial population with a local search technique to determine one or more of said new designs.

6. The method according to claim 1, further comprising the step of:
   searching said initial population with a genetically engineered search technique of said second techniques to determine one or more of said selected designs matched with said mutated designs.

7. The method according to claim 1, wherein said recombining is based on all of a plurality of device parameters from a random portion of said selected designs.

8. The method according to claim 1, wherein said mutating is based on all of a plurality of device parameters from a random portion of said selected designs.

9. The method according to claim 1, further comprising the step of:
   matching a plurality of devices in said initial designs where said devices have one or more common device parameters, wherein said evaluating is based on a result of said matching.

10. The method according to claim 1, further comprising a non-transitory storage medium recording a computer program comprising the steps of claim 1.

11. The method according to claim 1, wherein said initial population is based on a distribution of circuit areas.

12. The method according to claim 1, wherein a genetically engineered search technique of said second techniques comprises the steps of:
    selecting one or more highest ranked designs of said initial designs that satisfy said specification criteria;
    calculating a plurality of standard deviations and a plurality of median values in said highest ranked designs for each value of said circuit parameters and said specification criteria;
    determining a plurality of smallest standard deviations of said circuit parameters in said highest ranked designs; and
    generating one of said new designs having said values set to said media values.

13. The method according to claim 1, wherein a best compatible region strategy of said first techniques comprises the steps of:
    selecting a random design from said initial designs;
    generating a plurality of idealistic designs based on (i) said initial designs and (ii) a best of said specification criteria or said regions of operation;
    ranking said idealistic designs to determine a top design; and generating one of said new designs by combining said random design and said top design.

14. An apparatus comprising:
a memory configured to store a plurality of program instructions to implement an analog circuit design; and
one or more processors coupled to said memory and configured to execute said program instructions, wherein said program instructions when executed cause said processor to perform the steps of:
(A) evaluating an initial population comprising a plurality of initial designs of an analog circuit to determine to breed a plurality of new designs that either (i) satisfy one or more regions of operation or (ii) satisfy one or more specification criteria;
(B) selecting a plurality of subsets of said initial designs based on a plurality of first techniques and one or more second techniques to establish a plurality of selected designs, wherein a size of each subset selected by said first techniques and said second techniques is based on said determination to satisfy said regions of operation or said specification criteria;
(C) recombining some of said selected designs established by said first techniques to generate a plurality of recombined designs;
(D) mutating some of said recombined designs to generate a plurality of mutated designs;
(E) matching a plurality of circuit parameters of said mutated designs and said selected designs established by said second techniques to generate said new designs and
(F) generating a design file of at least one of said new designs, wherein a plurality of chips are fabricated using said design file.

15. The apparatus according to claim 14, wherein said first techniques to breed based on said regions of operation comprise (i) a best compatible region strategy and (ii) a tournament selection strategy.

16. The apparatus according to claim 14, wherein said first techniques to breed based on said specification criteria comprise (i) a best compatible specification strategy and (ii) a tournament selection strategy.

17. The apparatus according to claim 14, wherein said program instructions further comprise the step of:
searching said initial population with a correlation search technique to determine one or more of said new designs.

18. The apparatus according to claim 14, wherein said program instructions further comprise the step of:
searching said initial population with a local search technique to determine one or more of said new designs.

* * * * *